United States Patent
Walker et al.

(10) Patent No.: US 10,690,701 B2
(45) Date of Patent: *Jun. 23, 2020

(54) CORELESS CURRENT PROBE AND A METHOD OF MEASURING CURRENT

(71) Applicant: GMW Associates Incorporated, San Carlos, CA (US)

(72) Inventors: Ian James Walker, Woodside, CA (US); Karron Louis Law, Cheney, WA (US)

(73) Assignee: GMW ASSOCIATES INCORPORATED, San Carlos, CA (US)

(*) Notice: Subject to any disclaimer, the term of this patent is extended or adjusted under 35 U.S.C. 154(b) by 54 days.

This patent is subject to a terminal disclaimer.

(21) Appl. No.: 15/922,628

(22) Filed: Mar. 15, 2018

(65) Prior Publication Data

US 2018/0231588 A1    Aug. 16, 2018

Related U.S. Application Data

(63) Continuation of application No. 14/775,553, filed as application No. PCT/US2014/022775 on Mar. 10, 2014, now Pat. No. 9,952,257, which is a continuation of application No. 13/795,827, filed on Mar. 12, 2013.

(51) Int. Cl.
*G01R 15/20* (2006.01)
*G01R 19/00* (2006.01)

(52) U.S. Cl.
CPC ....... *G01R 15/202* (2013.01); *G01R 19/0092* (2013.01); *G01R 15/207* (2013.01)

(58) Field of Classification Search
CPC . G01R 15/202; G01R 19/0092; G01R 15/207
USPC .................................................. 324/207.2
See application file for complete search history.

(56) References Cited

U.S. PATENT DOCUMENTS

2014/0049255 A1* 2/2014 Kitamoto ............. G01R 15/207
                                                              324/244
2017/0089956 A1* 3/2017 Ausserlechner ....... G01R 33/09

* cited by examiner

*Primary Examiner* — Reena Aurora
(74) *Attorney, Agent, or Firm* — Haynes and Boone LLP

(57) ABSTRACT

A coreless current probe has a body defining an opening. A conductor carrying a current to be measured can be accommodated in the opening. At least three coreless single point magnetic field sensors are distributed in or on the body around the opening. The sensors are arranged so that the sum of the outputs each with appropriate weighting is zero in any homogenous field and with no enclosed current. The sensors outputs have differing weightings so as to maximize rejection by the probe of external magnetic fields.

29 Claims, 10 Drawing Sheets

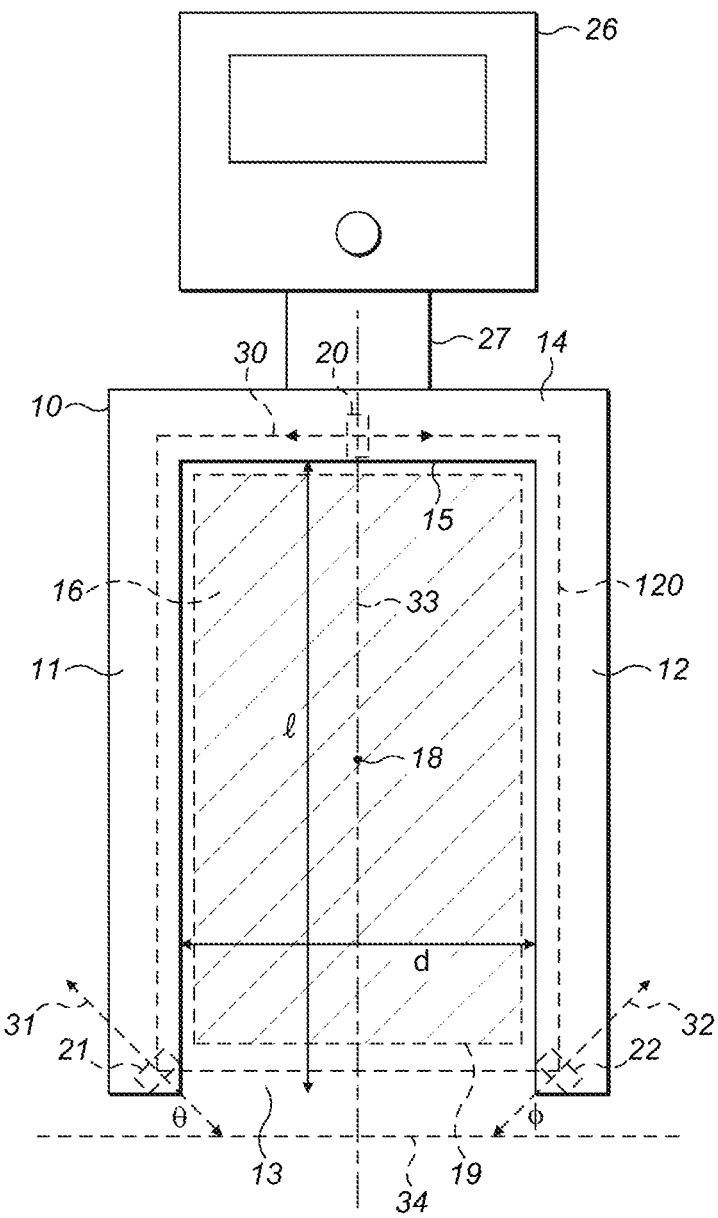
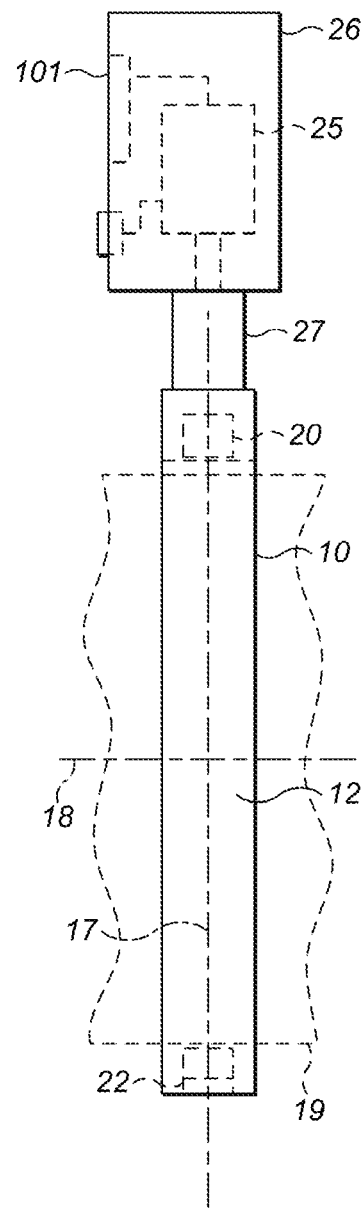
FIG. 1
FIG. 2

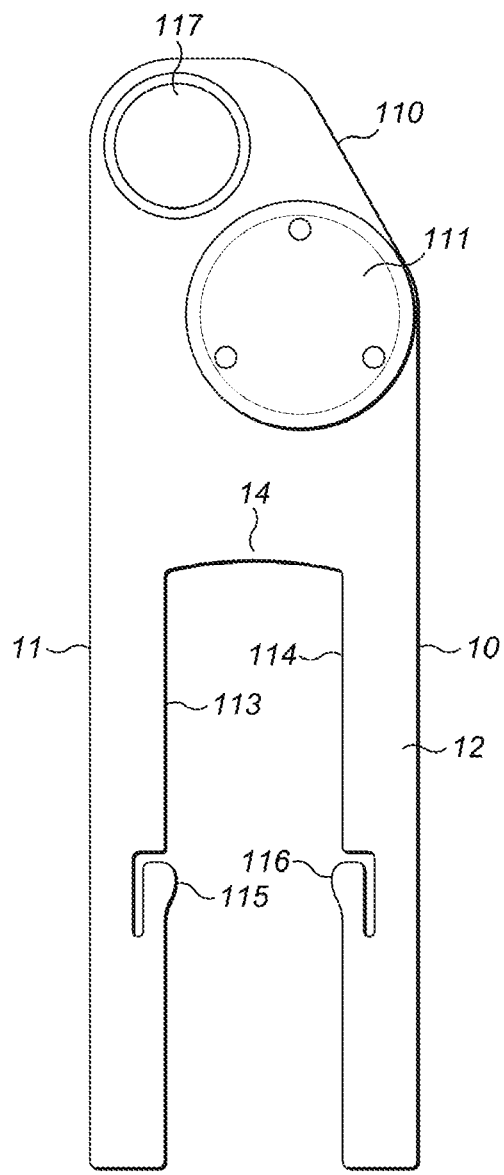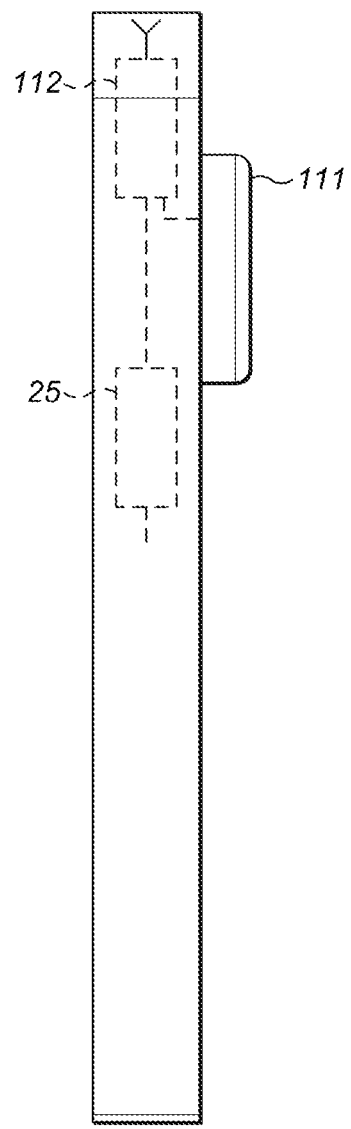
FIG. 8
FIG. 9

CORELESS CURRENT PROBE AND A METHOD OF MEASURING CURRENT

CROSS-REFERENCE TO RELATED APPLICATION

This application is a continuation of U.S. patent application Ser. No. 14/775,553, filed Sep. 11, 2015, which is a U.S. National Stage Entry of International Patent Application Serial No. PCT/US2014/022775, filed Mar. 10, 2014, which claims priority to U.S. patent application Ser. No. 13/795,827, filed Mar. 12, 2013. The entire disclosures of these applications are incorporated herein by reference in their entirety.

BACKGROUND

Field of the Invention

The present invention relates to current probes and methods of measuring current including direct current. In particular, the invention is concerned with coreless current probes, which do not contain a core or cores of material with relatively high magnetic permeability.

Background of the Invention

Probes and methods for measuring current flowing in a conductor are known which do not require any electrical contact to be made with the conductor. For measuring alternating currents in a conductor, contactless current probes typically provide a core of magnetic material completely embracing the conductor, in combination with a sense winding on the core, to sense alternating magnetic field generated in the core. Such alternating current probes are known as current transformers and a magnetic core completely surrounding the conductor carrying the current to be measured is desirable to ensure good flux linkage between the primary "winding" which is the conductor carrying the current to be measured, and the secondary winding which is the sense coil. It is known also to provide current transformer type current probes in which the magnetic core is in two parts, enabling the probe to be clamped around the conductor carrying the current to be measured. Further, it is known to use a Hall device to sense magnetic field in a small gap in the core surrounding the conductor, allowing measurement of direct current.

AC current sensing is also known using a Rogowski coil, which is an air core coil surrounding the conductor carrying the current to be measured. In particular, U.S. Pat. No. 5,057,769—Edwards discloses a C-shaped sensing coil mounted on a skeleton board to enable the coil to be located embracing a conductor between the arms of the C. Compensating coils are provided at the ends of the main C-shaped coil to provide some compensation for the effect of the gap in the main sensing coil.

Generally, use of current transformer type current probes with cores of magnetic material is unsuitable in regions of very high magnetic fields which may cause saturation of the magnetic core. Furthermore, inductively linked current sensing devices are not suitable for measuring DC current. Sensors are known which can measure the magnetic field intensity at a single point. Examples of such sensors include MEMS sensors, various kinds of magnetometer, and in particular Hall Effect sensors. According to Ampere's Law, the line integral of magnetic fields around a closed loop is proportional to the total current embraced by the loop. This simple expression of the law is true in magneto-static situations, when there is no time varying charge density or electromagnetic propagation. U.S. Pat. No. 4,625,166—Steingroever et al discloses a DC current sensor formed as a ring of Hall devices surrounding the current conductor. The sum of the outputs of the ring of Hall devices provides an approximation to the line integral of magnetic field around the conductor being measured, so that a value for the current in the conductor is determined.

U.S. Pat. No. 7,321,226—Yakymyshyn et al discloses a current sensor employing a ring of Hall devices mounted in hinged housings to enable the probe to be clipped around the conductor carrying the current to be measured. Again, by providing multiple Hall devices in a ring completely surrounding the conductor, the sum of the outputs of the Hall devices can provide good approximation to Ampere's Law, thereby providing a good measurement of current in the conductor.

Measuring current in a conductor using multiple coreless single point magnetic field sensors, such as Hall devices, presents problems when it is not possible to obtain access completely around the conductor in which the current is to be measured. U.S. Pat. No. 7,445,696—You et al. discloses a device for measuring electric current in a conductor, where the conductor is a bus bar feeding current to and from the electrodes of the electro-chemical cells in an electro-metallurgical system. Such electro-metallurgical systems include electro-refining and electrowinning systems for copper, zinc, and other metals. Although it may be desirable to monitor the current flowing in a single bus bar feeding a single electrode of such an electro-metallurgical system, the physical arrangement of such systems means that it may not be practicable to obtain access for a current sensing probe completely around the bus bar. Furthermore, the presence of multiple current carrying bus bars in close proximity leads to relatively high magnetic fields in the vicinity of each bus bar, including high levels of external magnetic field which is not produced by a current to be measured flowing in a target bus bar. The patent to You et al. describes using multiple Hall effect sensors mounted immediately above the bus bar being monitored. A proximity sensor is also provided on the probe to ensure the probe is in close contact with the top of the bus bar being monitored.

BRIEF SUMMARY OF THE INVENTION

In one aspect the invention provides a coreless current probe comprising a body defining an opening in a plane and a central line through said opening normal to said plane, whereby a conductor carrying a current to be measured can be accommodated in said opening so as to extend through said opening parallel to said central line. At least three coreless single point magnetic field sensors are distributed in said body around said opening with respective linear spacings between successive said sensors. At least one of said linear spacings is different from another of said linear spacings. The sensors each have a respective axis of magnetic field sensitivity and they are arranged in said body so that each of said axes is not co-planar with said central line. Sensing circuitry is connected to said sensors and is operative to produce for each of said sensors a respective sensor signal which is a measure of the angle component of magnetic field at the sensor aligned with the respective axis of magnetic field sensitivity of the sensor. The sensors are arranged such that there are values of $c_r$ for which, in any homogeneous magnetic field, $$\sum_{r=1}^{n} c_r h_r = 0,$$

where n is the number of said magnetic field sensors, $h_r$ is said measure of said magnetic field component for the $r^{th}$ sensor, and $c_r$ is a constant factor for the $r^{th}$ sensor. The sensing circuitry is further operative to combine said measures $h_r$ employing the summation $$\sum_{r=1}^{n} c_r h_r$$

to produce a measured current value representing current flowing in a conductor accommodated in said opening in said body of said probe, where at least one value of $c_r$ in said summation differs from other values of $c_r$.

In a further aspect, the invention provides a coreless current probe comprising a body defining an opening in a plane and a central line through the opening normal to said plane, whereby a conductor carrying a current to be measured can be accommodated in said opening so as to extend through said opening parallel to said central line. A plurality of coreless single point magnetic field sensors are distributed in said body around said opening such that said sensors are not all located in a common cylindrical surface having said central line as its axis. The sensors each have a respective axis of magnetic field sensitivity and they are arranged in said body so that each of said axes is not co-planar with said central line. Sensing circuitry is connected to said sensors and is operative to produce for each of said sensors a respective sensor signal which is a measure of the angle component of magnetic field at the sensor aligned with the respective axis of magnetic field sensitivity of the sensor. The sensors are arranged such that there are values of $c_r$ for which, in any homogeneous magnetic field, $$\sum_{r=1}^{n} c_r h_r = 0,$$

where n is the number of said magnetic field sensors, $h_r$ is said measure of said magnetic field component for the $r^{th}$ sensor, and $c_r$ is a constant factor for the $r^{th}$ sensor. The sensing circuitry is further operative to combine said measures $h_r$ employing the summation $$\sum_{r=1}^{n} c_r h_r$$

to produce a measured current value representing current flowing in a conductor accommodated in said opening in said body of said probe, where at least one value of $c_r$ in said summation differs from other values of $c_r$.

In a still further aspect, the invention provides a coreless current probe comprising a U-shaped body having arms, an open end and a cross piece forming a closed end opposite to the open end. The U-shaped body defines an opening having a width between the arms and a length from the closed end to the open end. The length is not less than the width and the width and the length define a plane of the opening as well as a central line normal to the plane. A conductor carrying a current to be measured can be engaged by the body of the probe so as to extend through the opening parallel to the central line. A plurality of coreless single point magnetic field sensors are distributed in the body around the opening. A respective one of the sensors is located at an end of each of the arms of the U-shaped body, so as to be on each side of the open end of the body. At least one further of the sensors is located at the closed end of the body. The sensors each have a respective axis of magnetic field sensitivity and are arranged in the body so that each of these axes is not co-planar with the central line. Sensing circuitry is connected to the sensors and is operative to produce for each of the sensors a respective sensor signal which is a measure of the angle component of magnetic field at the sensor aligned with its respective axis of magnetic field sensitivity. The sensors are arranged in the body in such a way that there can be found values of $c_r$ for which, in any homogeneous magnetic field, $$\sum_{r=1}^{n} c_r h_r = 0,$$

where n is the number of the magnetic field sensors, $h_r$ is the measure of the magnetic field component for the $r^{th}$ sensor, and $c_r$ is a constant factor for the $r^{th}$ sensor. The sensing circuitry is operative to combine the measures $h_r$ to produce a measured current value representing current flowing in a conductor engaged by the U-shaped body of the probe.

The invention further provides a method of measuring current flowing in a conductor, where the conductor has minimum and maximum orthogonal cross-sectional dimensions. In the method, an Ampere's Law integration path is defined around the conductor in an integration plane perpendicular to a central line of the conductor, where the path has minimum and maximum orthogonal dimensions which exceed the dimensions of the conductor. A respective angle component of magnetic field is measured at each of a plurality of locations on this integration path. An adjacent pair of these locations is at one end of the maximum dimension of the path and spaced apart by the minimum dimension of the path. The third of these locations is at the other end of the maximum dimension of the path. The locations and the orientations of the respective angle components of magnetic field being measured are selected such that values can be found of $c_r$ for which, in any homogeneous magnetic field, $$\sum_{r=1}^{n} c_r h_r = 0,$$

where n is the number of the above referred locations, $h_r$ is the measured value of the magnetic field component at the $r^{th}$ location and $c_r$ is a constant factor for the $r^{th}$ location. In the method, the measured values $h_r$ are combined to produce a value of the current being measured.

The invention still further provides a method of measuring current flowing in a conductor comprising the following steps. A respective angle component of magnetic field is measured at each of a plurality of locations distributed around the conductor. These locations and the orientations of said angle components are selected such that there are values of $c_r$ for which, in any homogeneous field, $$\sum_{r=1}^{n} c_r h_r = 0,$$

where n is the number of locations, $h_r$ is the measured value of said magnetic field component, and $c_r$ is a constant factor for the $r^{th}$ location.

These measured values $h_r$ are combined, employing the summation $$\sum_{r=1}^{n} c_r h_r$$

with selected values of $c_r$, to produce a value of said current, where at least one value of $c_r$ in said summation is different from other values of $c_r$.

BRIEF DESCRIPTION OF THE DRAWINGS

Embodiments of the invention will be described below with reference to the following figures.

FIG. 1 is a schematic representation of an example of a coreless current probe embodying the present invention with a U-shaped body, using three magnetic field sensors.

FIG. 2 is a view of the current probe of FIG. 1 taken from one side and showing sensing circuitry housed in the probe.

FIG. 8 is a wireless enabled current probe embodying the present invention.

FIG. 9 is a view of the current probe of FIG. 8 taken from one side and showing sensing circuitry and wireless circuitry in the probe.

DETAILED DESCRIPTION OF THE EMBODIMENTS

Figure 3:
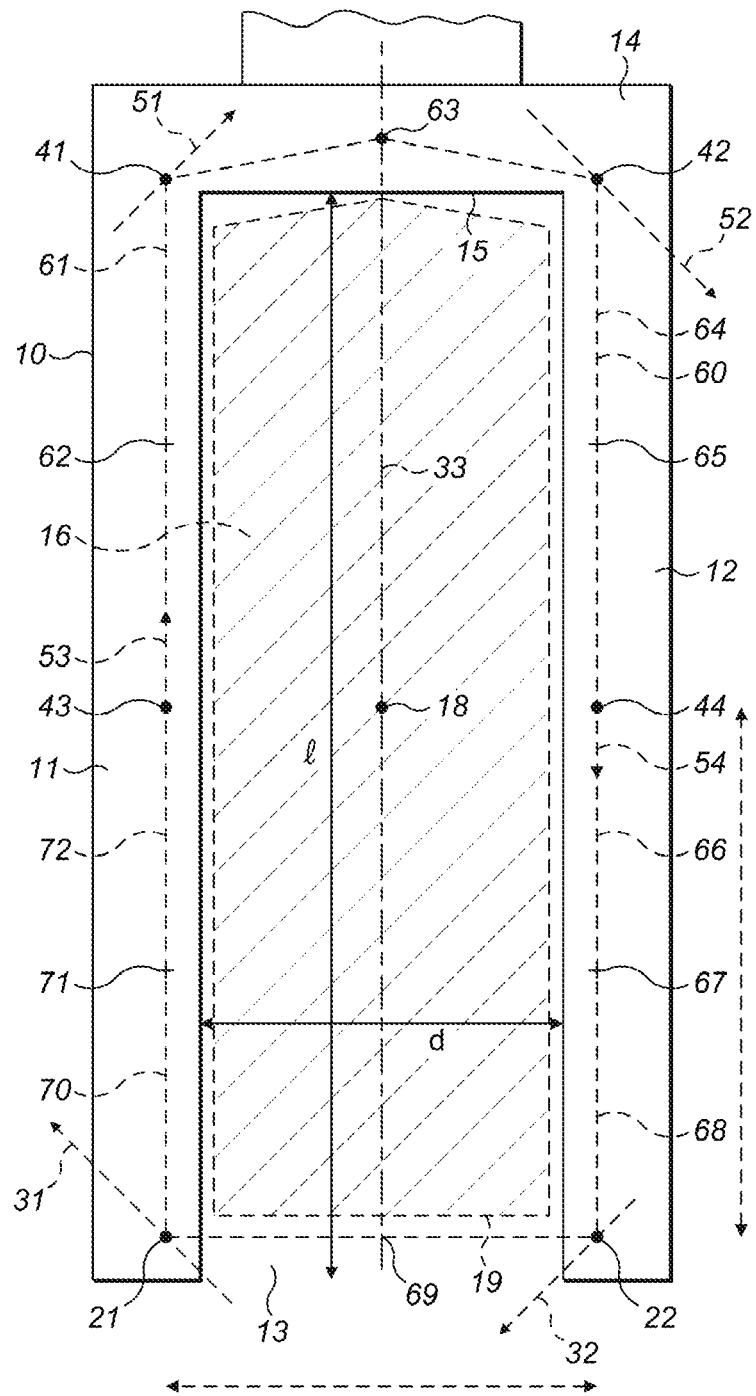
FIG. 3 illustrates further examples of current probe embodying the present invention, using four magnetic field sensors, and using six magnetic field sensors.

FIGS. 1 and 2 illustrate a basic embodiment of the invention. A coreless current probe is shown having a U-shaped body 10 with arms 11 and 12, an open end 13 and a cross piece 14 forming a closed end 15 which is opposite to the open end 13. The U-shaped body 10 defines an opening 16 having a width d between the arms 11 and 12, and a length € from the closed end 15 to the open end 13. As illustrated in FIG. 1 the length C is not less than the width d and in the example illustrated is in fact substantially greater than the width d. The width and length dimensions of the opening 16 on the U-shaped body 10 define a plane of the opening which is substantially the plane of the paper in FIG. 1, and is a plane perpendicular to the paper along the line 17 in FIG. 2. The opening 16 further defines a central line 18, represented in FIG. 1 by a dot 18 which is normal to the plane of the opening and located substantially centrally in the opening.

In use, the U-shaped body 10 of the current probe illustrated in FIG. 1 can be engaged around a conductor 19 carrying a current to be measured. When engaged by the U-shaped body of the probe, the conductor 19 extends through the opening parallel to the central line 18. The conductor 19 is shown in cross-section in FIG. 1 within a dashed outline. A short section of the conductor 19 is illustrated in FIG. 2 extending through the opening 16.

In FIGS. 1 and 2, a plurality of coreless single point magnetic field sensors are distributed in the U-shaped body 10 around the opening 16. In the example of FIGS. 1 and 2, three such single point magnetic field sensors are illustrated at 20, 21 and 22. In one example, the single point magnetic field sensors 20, 21 and 22 comprise Hall effect sensors. However, any type of sensor may be used which is capable of producing an electrical signal representing the intensity of magnetic field at the location of the sensor. The magnetic field sensors employed in the example of the invention are vector magnetometers, in the sense that each of the sensors has a respective axis of magnetic field sensitivity. Apart from Hall effect devices, alternative magnetic field sensors include magneto resistive devices.

In the example illustrated, a respective magnetic field sensor 21, 22 is located at an end of each of the arms 11 and 12 of the U-shaped body 10, at the open end 13 of the body. A third sensor 20 is located at the closed end 15 of the body. In the particular example, sensor 20 is located mid-way along the cross piece 14 at the closed end 15 of the body. The magnetic field sensors 20, 21 and 22 are intended to detect the magnetic field generated by current flowing in the conductor 19 in the direction of the conductor, that is to say parallel to the central line 18. Accordingly, it is important that the axis of magnetic field sensitivity of each of the sensors 20, 21 and 22 is not aligned in a plane containing the central line 18. Otherwise the sensors would have minimum sensitivity to any magnetic fields generated by current flowing in the conductor parallel to the central line 18.

Generally, the sensors 20, 21 and 22 are intended to detect magnetic field generated by the current flowing along the conductor 19 and should preferably be arranged in the body 10 so as to maximize detection of this magnetic field, whilst having a minimal response to external magnetic fields which are not produced by currents in the conductor 19. To this end, the location and orientation of the sensors 20, 21 and 22 in the U-shaped body 10 are selected so that it is possible to derive a signal combining the outputs of these sensors, which is insensitive at least to any homogeneous magnetic field in the region of the probe. Such a homogeneous magnetic field is a field which would be generated externally of the probe, so that the field lines are substantially linear with a uniform flux density everywhere over the probe.

Each of the magnetic field sensors 20, 21 and 22 is connected with sensing circuitry, which is shown by the box 25 located in a housing 26 connected to cross piece 14 of the U-shaped body 10 by a neck piece 27. The sensing circuitry 25 operates to produce for each of the sensors 20, 21 and 22 a respective sensor signal which is a measure of the angle component of magnetic field at the respective sensor which is aligned with the axis of magnetic field sensitivity of the sensor.

In order for it to be possible for the sensors 20, 21 and 22 of the probe to reject a homogeneous external magnetic field, the sensors must be arranged in the U-shaped body 10 such that values $c_r$ can be found for which, in any homogeneous magnetic field, $$\sum_{r=1}^{n} c_r h_r = 0,$$

where n is the number of magnetic field sensors, $h_r$ is the measure of the magnetic field component for the $r^{th}$ sensor and $c_r$ is a constant factor for the $r^{th}$ factor. So long as the sensors in a probe are arranged and orientated such that the values of $c_r$ can be obtained to satisfy the summation equation above, it is possible to derive a combined signal from the outputs of the sensors which will reject external homogeneous magnetic fields.

In the example illustrated in FIG. 1, the sensor 20 at the centre of the cross piece 14 is illustrated with its axis of sensitivity 30 directed in the plane of the opening 16 of the U-shaped body 10, and normal to a central plane 33 which contains the central line 18 and is mid-way between the arms 11 and 12 of the U-shaped body 10. The field sensor 21 is shown with its axis of sensitivity 31 also in the plane of the opening 16 and at an angle θ to a transverse line 34 which is normal to the central plane 33. The sensor 22 is shown with its axis of sensitivity 32 again in the plane of the opening and at an angle φ to the transverse line 34. If the sensors 20, 21 and 22 have the same nominal sensitivity to magnetic field intensity aligned with a respective axis of the sensitivity of the sensors, it can be shown that for a uniform homogeneous horizontal magnetic field in the plane of the opening 16 and parallel to the transverse line 34, the summation $$\sum_{r=1}^{3} c_r h_r = 0$$

is true if $c_1 = c_2 \cos θ + c_3 \cos φ$. Similarly, in order for the above summation to be zero in the presence of a vertical homogeneous magnetic field in the plane of the opening 16 and normal to the transverse line 34, $c_2 \sin θ = c_3 \sin φ$. Accordingly, in the general case illustrated in FIG. 1, values of $c_1$, $c_2$ and $c_3$ can be identified for which the summation is zero in any homogeneous magnetic field.

In practice, it is convenient to orientate the sensors 21 and 22 so that θ=φ=45°, whereupon the summation is zero if $c_1 = \sqrt{2} \ast c_2 = \sqrt{2} \ast c_3$.

In the probe illustrated in FIGS. 1 and 2, the sensing circuitry 25 is arranged to be operative to combine the signals from the sensors 20, 21 and 22, which comprise measures $h_1$, $h_2$ and $h_3$ of the angle component of magnetic field at the respective sensors, to produce a measured current value representing current flowing in the conductor 19 engaged by the U-shaped body 10 of the probe. In order fully to reject external homogeneous magnetic fields, the sensing circuitry 25 will combine the measures $h_r$ by performing the summation $$\sum_{r=1}^{3} c_r h_r,$$

using the values of $c_r$ as calculated above for rejecting homogeneous external fields.

FIGS. 1 and 2 illustrate a basic example of the invention employing only three magnetic field sensors 20, 21 and 22. In order for the probe accurately to measure the current flowing in conductor 19 engaged by the probe, in the presence of relatively strong external magnetic fields, more than three magnetic field sensors will normally be required in the U-shaped body 10 of the probe. Referring to FIG. 3, improved performance may be obtained using four magnetic field sensors distributed symmetrically in the U-shaped body 10 about the central plane 33, which constitutes a plane of symmetry. The sensors 21 and 22 at the ends of the arms 11 and 12 on each side of the opening end 13 of the U-shaped body 10 are provided, as in the example of FIGS. 1 and 2, with their axes of magnetic sensitivity aligned at the same angle to transverse line 34. The single sensor 20 at the centre of the cross piece 14 is replaced, in the example of FIG. 3, with a pair of sensors 41 and 42 mirroring the sensors 21 and 22. As can be seen, in each case the axes of magnetic sensitivity 31 and 32 of the sensors 21 and 22, and 51 and 52 of the sensors 41 and 42 are each at a respective acute angle to the plane of symmetry 33, so that each of the axes 21, 22, 41 and 52 is generally tangential to the opening 16 between the arms 11 and 12 of the U-shaped body 10. In this way, each of the axes of sensitivity 31, 32, 51 and 52 is generally aligned with the direction of the magnetic field that will be generated by a current flowing in the conductor 19 engaged by the probe. If the angles of the axes of sensitivity 31, 32, 51 and 52, with respect to lines normal to the plane of symmetry 33, are all the same, then the factors $c_1$, $c_2$, $c_3$ and $c_4$ applied by the sensing circuitry 25 to the measures $h_1$, $h_2$, $h_3$ and $h_4$ from the four sensors should again be the same, in order to reject homogeneous external fields.

FIG. 3 also illustrates a further preferred arrangement which uses six sensors distributed around the U-shaped body 10 of the probe. In this embodiment, an additional pair of sensors 43 and 44 is located in the U-shaped body 10 substantially midway along the arms 11 and 12. Accordingly, the six sensors shown in FIG. 3 comprise a first pair of sensors 21 and 22 at the ends of the arms of the U-shaped body on either side of the open end 13, a second pair 41 and 42 at the closed end of the U-shaped body 10, and a third pair comprising the additional sensors 43 and 44 midway along the arms 11 and 12. The sensors of each of the first, second and third pairs are disposed spaced uniformly apart symmetrically on opposite sides of the plane of symmetry 33 which contains the central line 18 and is equally spaced between the arms. Each of the sensors 21, 22, 41 and 42 of the first and second pairs is orientated in the body so that its axis of sensitivity is in the plane of the opening and at a respective acute angle to the plane of symmetry 33, so as to be generally tangential to the opening. Each of the sensors 43 and 44 of the third pair is orientated in the body to have its axis of sensitivity in the plane of the opening and parallel to the plane of symmetry 33. The axes of sensitivity of the additional third pair of sensors 43 and 44 are illustrated by the lines and arrows 53 and 54 respectively.

Although the U-shaped body of the probe illustrated in FIG. 3 is generally similar to that illustrated in FIGS. 1 and 2, the aspect ratio of the U-shaped body in FIG. 3 is somewhat greater, in that the arms 11 and 12 of the U-shaped body 10 are more than twice as long as the spacing between the arms, so that l>2 d.

If the six magnetic field sensors are numbered in order in a clockwise direction around the opening 16, starting with sensor 42 as number 1, then the components of the summation discussed above are $c_1 h_1$ for sensor 42, $c_2 h_2$ for sensor 44, $c_3 h_3$ for sensor 22, $c_4 h_4$ for sensor 21, $c_5 h_5$ for sensor 43 and $c_6 h_6$ for sensor 41. Again assuming that the sensitivity to magnetic field of each of the six sensors is the same, so that the measure h for each sensor would be the same if the sensor is in an identical magnetic field aligned with the respective axis of sensitivity of the sensor, then the requirement that the summation $$\sum_{r=1}^{6} c_r h_r = 0$$

in order to reject homogeneous external fields is met so long as $c_1=c_3=c_4=c_6$ and $c_2=c_5$. Note however, that there is no constraint on the relationship between the value of c for sensors 44 and 43 at the mid-points of the arms 12 and 11 (of $c_2$ and $c_5$) and the value of c for the sensors 42, 22, 21 and 41 at the corners of the opening 16 ($c_1$, $c_3$, $c_4$, $c_6$). In order to improve the performance of the probe illustrated in FIG. 3 with six magnetic field sensors, the sensing circuitry is adapted to derive the summation $$\sum_{r=1}^{6} c_r h_r,$$

using values of $c_r$ which are selected to maximize rejection by the probe of external magnetic fields which are not produced by currents in the conductor probe 19 engaged by the probe. Accordingly, in this example, the common value of $c_2$ and $c_5$ is selected accordingly to be different from the common value of $c_1$, $c_3$, $c_4$ and $c_6$ in order to maximize rejection of external magnetic fields.

It should be understood that the current probe described above with a U-shaped body carrying plural magnetic field sensors can be used to measure the current flowing in any conductor engaged between the arms 11 and 16 of the U-shaped body. Factors $c_r$ can be applied to the signals from the magnetic field sensors to produce a combined measurement $$\sum_{r=1}^{n} c_r h_r$$

representing current flowing in the conductor and rejecting the effect of external fields. In order to reject external fields successfully, the summation above should, as far as possible, approximate to the line integral along a closed loop around the conductor carrying the current to be measured. In order to approximate to the line integral value most accurately, and to reject external fields most successfully, it is desirable that the magnetic sensors in the U-shaped body are located along a closed loop path which has the shortest possible length surrounding the conductor to be measured. Accordingly, best results are obtained if the opening 16 of the U-shaped body 10 is sized so as closely to fit around a conductor 19 carrying the current to be measured.

An example of conductor 19 as illustrated in FIG. 3 has a substantially rectangular cross-section with a minimum orthogonal dimension which is only slightly less than the width d between the inner faces of the arms 11 and 12 of the U-shaped body. Also, the maximum transverse cross-sectional dimension of the conductor 19 is only slightly shorter than the length C between the open and closed ends 13 and 15 of the U-shaped body 10. Then, a dashed line 60 represents a minimum length closed loop encircling the conductor 19, and magnetic sensors 21, 22, 41, 42 and 43, 44 are shown, each with its point of sensitivity located on the line 60.

According to Ampere's Law, the line integral of magnetic fields along the minimum length loop 60 provides a measure of current flowing in the conductor 19. However, in the example of FIG. 3, actual magnetic field measurements are made only at six points around the minimum length loop 60. The sensors 21, 22, 41, 42 and 43, 44 are arranged with their axes of sensitivity generally aligned with the local direction of the magnetic field which would be produced by current flowing in the conductor 19, in the absence of any external fields. With this orientation of the magnetic field sensors, the sensitivity of the sensors to the magnetic field to be measured, in effect to the required signal, is maximized. In the absence of any external fields, the summation $$\sum_{r=1}^{6} h_r$$

would be proportional to the current flowing in the conductor 19. However, in order to provide discrimination between the magnetic field generated by current flowing in the conductor 19 and external fields, it is desirable to calculate the summation $$\sum_{r=1}^{6} c_r h_r,$$

where the values of $c_r$ are selected to provide a better approximation to the calculated line integral of magnetic field along the minimum length path 60.

A useful approach to determining appropriate values of $c_r$ is to assign to each of the sensors in FIG. 3, a line segment along the minimum length loop 60 on either side of the sensor. For example, a line segment 61 may be assigned to sensor 41, extending from the mid-point 62 between sensor 41 and sensor 43 and the mid-point 63 between sensor 41 and sensor 42. Similarly, line segment 64 is assigned to sensor 42 extending from mid-point 63 to a mid-point 65 between sensor 42 and 44. A line segment 66 is assigned to sensor 44 extending from mid-point 65 to a mid-point 67 between sensor 44 and sensor 22. Line segment 68 is assigned to sensor 22 extending from the mid-point 67 to a mid-point 69 between sensor 22 and sensor 21. Line segment 70 is assigned to sensor 21 extending from the mid-point 69 to a mid-point 71 between sensor 21 and sensor 43. Line segment 72 is then assigned to sensor 43 extending from the mid-point 71 to the mid-point 62.

In order to determine values of $c_r$ in the above summation which provide a better approximation to the line integral around the minimum length loop 60, a computer model is made of the magnetic field generated by current flowing along conductor 19, in the absence of any extraneous magnetic fields. It is then computationally straightforward to calculate the line integral of magnetic field along each of the line segments 64, 66, 68, 70, 72 and 61. These calculated line segments integrals are identified respectively as $s_r$, where r is 1-6. At the same time, it is also straightforward to identify in the computer model of the magnetic field the magnetic field intensity values $h'_r$, which would be determined by the six magnetic field sensors.

In order to provide a line integral value of $s'_r$ over a line segment length $a_r$ in a magnetic field produced by current in the conductor 19 and in the absence of any extraneous field, the product $h'_r$ $a_r$ should be multiplied by the factor $s'_r/h'_r a_r$. In a more general magnetic field comprising not only the magnetic field produced by current flowing in the conductor 19 but also external magnetic field, the line integral $s$, over the line segment for the $r^{th}$ sensor may be expressed $s_r=(s'_r/h'_r a_r)*h_r*a_r=(s'_r/h'_r)*h_r$, where hr is the measured field at the rth sensor. It can be seen therefore that a more accurate approximation to the line integral of magnetic field around the minimum length loop 60 illustrated in FIG. 3, in a magnetic field comprising not only the field generated by current in the conductor 19, but also external magnetic field, is represented by the above referred summation $$\sum_{r=1}^{6} c_r h_r,$$

where $c_r=s'_r/h'_r$. Since $s'_r$ and $h'_r$ can be calculated in a computer model of the field generated by current flowing in the conductor 19, calculated values can be obtained for $c_r$.

In the example illustrated in FIG. 3, the minimum length loop 60 is shown to be slightly asymmetrical from top to bottom, since the loop has an apex point at 63 mid-way between the upper sensors 41 and 42. This loop shape corresponds to the cross-sectional shape of the conductor 19. Because of this, the computation of $s'_r$ as outlined above for the line segments corresponding to sensors 41 and 42 will be slightly different to the computations of $s'_r$ for the line segments corresponding to the sensors 21 and 22 at the open end of the U-shaped probe.

Nevertheless, the values of $c_r$ should be symmetrical so that in a homogeneous external field only, in the absence of any current flowing through the conductor 19, the summation of $c_r h_r$ is zero. Accordingly, in order to achieve this full rejection of any external homogeneous field, an average is taken of the calculated values $c_r$ for the four corner sensors 41, 42 and 21, 22, in order to provide identical values of $c_r$ for these sensors.

Full rejection of a uniform external field is important because any external magnetic field can be expanded into a uniform field plus a series of spatial harmonics. In most cases, the uniform field component of any external field has the largest contribution to the external field.

It can be seen from the above discussion of a procedure for calculating values $c_r$ for use in the summation $$\sum_{r=1}^{n} c_r h_r,$$

that the lengths $a_r$ of the line segments is somewhat arbitrary. In particular, it can be seen that the location of the mid-point 63 between upper sensors 41 and 42 on the U-shaped probe is determined by the requirements for symmetry, as is the position of the mid-point 69 between the sensors 21 and 22. Again for symmetry end points 65 and 67 should be equally spaced on opposite sides of sensor 44, and mid-points 62 and 71 should be equally spaced on opposite sides of sensor 43. However, there is no clear indication for the overall length of the segments 66 and 72 associated with the mid-point sensors 43 and 44. In practice, it can be seen that the overall length of the line segments associated with the mid-point sensors 43 and 44 may be extended to accommodate a region along the flanks of the conductor 19 over which the magnetic field produced by currents flowing in the conductor 19 extends generally parallel to the these flanks, at least at locations closely spaced to the flanks. In practice, the current probe can be optimized for a particular installation by determining empirically the length of the line segments 66 and 72 associated with the mid-point sensors 43 and 44, which will maximize rejection of unwanted external magnetic fields.

The coreless current probes with U-shaped bodies described above can have general application for measuring currents flowing in conductors, particularly where the physical construction and arrangement of the conductors to be measured does not permit the current probe to be wrapped entirely around the conductor. However, when the probe can be installed around the conductor, e.g. before the conductor is finally connected in its energizing circuit, the U-shape may not be required, and a probe body which extends fully around the conductor may be employed.

The current probe is also especially suited to arrangements where there may be high levels of external magnetic field, for example in circumstances where current is to be measured in a single conductor of an array of conductors carrying substantial currents. In particular the probe can be used to measure DC currents, as well as AC currents.

Figure 4:
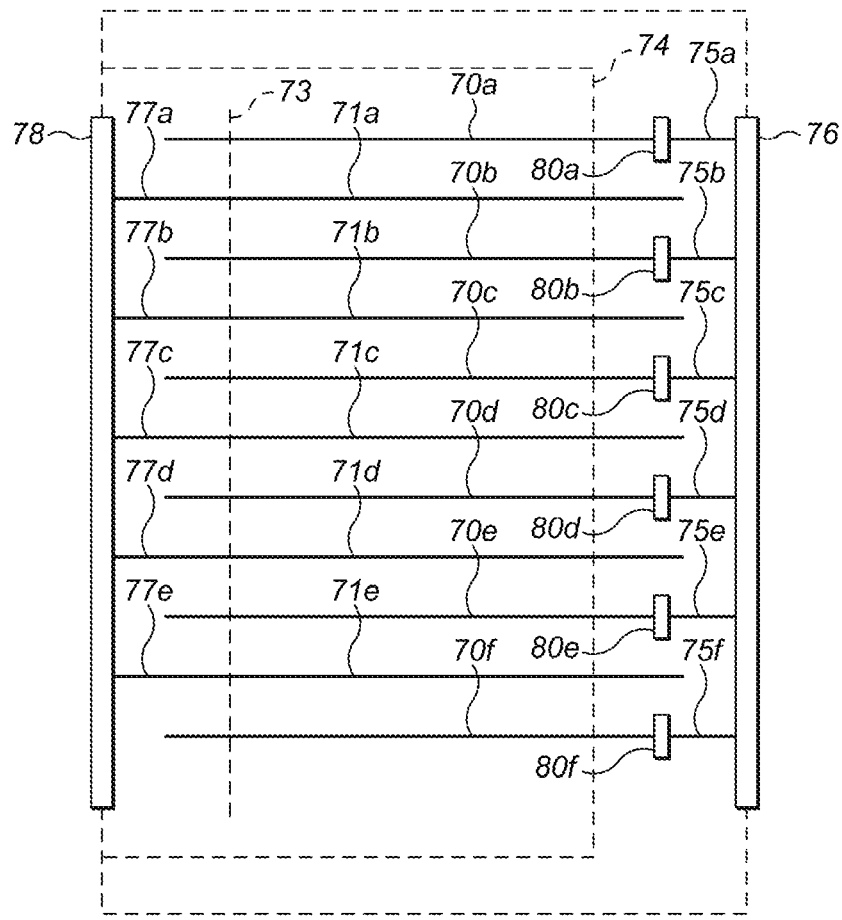
FIG. 4 illustrates an electrowinning tank with cathodes and anodes, illustrating a preferred use of the current probe.

In large scale electro-chemical processing plants, particularly plants for electrowinning metals, a typical installation may comprise multiple tanks containing arrays of cathodes and anodes. For example, a single row of electrodes may comprise 50 cathodes and 51 anodes arranged alternating across the tank. FIG. 4 illustrates schematically part of an array of cathodes and anodes for an electrowinning installation comprising anodes 70a, 70b, 70c, 70d, 70e, 70f, alternating with cathodes 71a, 71b, 71c, 71d and 71e etc. Although only six anodes and five cathodes are illustrated in FIG. 4, it should be understood that these will comprise just part of a much larger array for example comprising 51 anodes and 50 cathodes.

Each anode and cathode comprises a plate electrode extending normal to the page of the drawing of FIG. 4 into an electrolyte solution in the processing tank. The plates of the anodes and cathodes generally extend between the dotted lines 72 and 73 shown in FIG. 4. Anode bus bars 75a, 75b, 75c, 75d, 75e, 75f are provided supporting the anodes 70a-f and are each connecting along the right hand side in FIG. 4 to an anode supply connector 76. Similarly, cathode bus bars 77a-e respectively support cathodes 71a-e and are each connected along the left hand side of FIG. 4 to a cathode supply connector 78.

Figure 5:
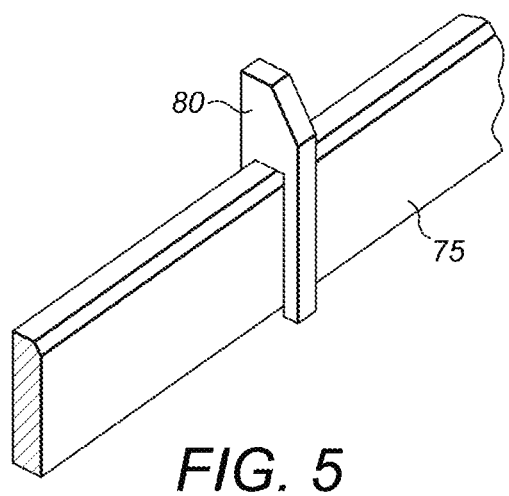
FIG. 5 is a perspective view of a current probe engaged on a bus bar whose current is to be measured.

In an electrowinning installation such as illustrated in FIG. 4, neighboring anode and cathode bus bars are relatively close together and may be separated by a spacing which is no greater than the width of each bus bar. It is not, therefore, possible to access each of the bus bars to clip a current probe completely around the bus bar. FIG. 5 illustrates in perspective view a typical anode bus bar 75, which is shaped with a generally rectilinear cross-section having a relatively high aspect ratio. This shape allows the bus bar to carry the high levels of current needed for an electrowinning process, typically in excess of 1000 amps for each anode or cathode bus bar, while minimizing the spacing between adjacent bus bars. FIG. 5 also illustrates a coreless current probe 80, of the kind described above with a U-shaped body, engaged on the bus bar 75. For best performance, the current probe 80 is dimensioned specifically for the particular bus bar 75, so that the width d between the arms 11 and 12 of the U-shaped body 10 is just sufficient to slide over the minimum cross-sectional dimension of the bus bar 75. The internal maximum dimension l of the U-shaped body is sized so that the full maximum cross-sectional dimension of the bus bar 75 is accommodated in the opening of the U-shaped body, for example as shown in the cross-section in FIG. 3.

A separate current probe 80a-f may be located engaged with each of the anode bus bars 75a-f, as illustrated in FIG. 4.

As mentioned previously, each of the anode bus bars 75a-f in an electrowinning installation may carry a current in excess of 1000 amps. Similar currents will be carried by the cathode bus bars 70a-e. It can be seen, therefore, that each of the current probes 80a-f will be in a region of substantial magnetic field in addition to magnetic field generated by current flowing in the respective bus bar 75a-f, that is the current to be measured in each case. Furthermore, the nature of the external magnetic field experienced by each of the current probes 80a-80f will be different depending on the location of the probe across the array of bus bars. Nevertheless, it has been found that a current probe with a U-shaped body and six sensors distributed as illustrated in FIG. 3 can measure the current flowing in a respective bus bar to an accuracy of better than about 1%, at any position across an array of bus bars comprising for example 51 anodes and 50 cathodes.

Figure 6:
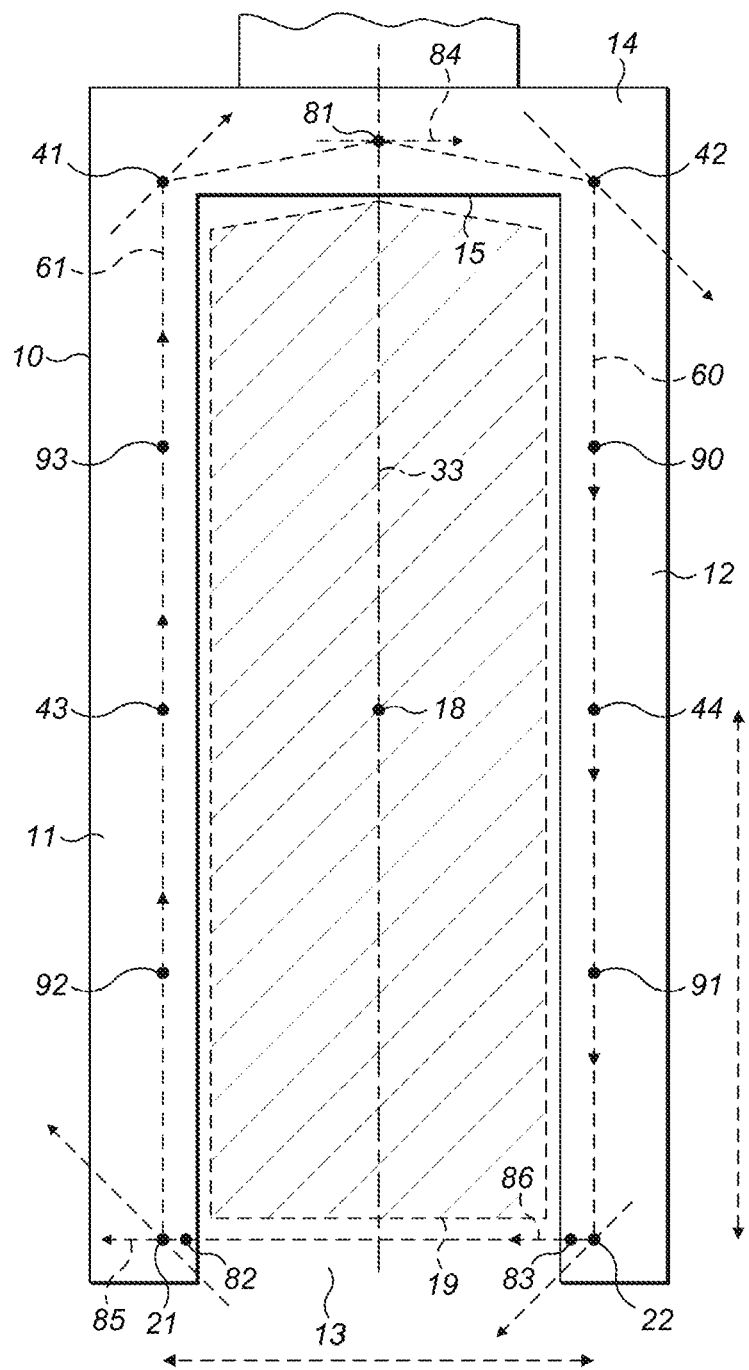
FIG. 6 illustrates further examples of current probe embodying the present invention.

Some improvement in the rejection of magnetic fields is obtained by increasing the number of sensors located in the U-shaped body 10 of the probe, along the minimum length loop 60 as defined previously. FIG. 6 represents the U-shaped body 10 of a probe containing additional magnetic field sensors. In FIG. 6, features common to the probe of FIG. 3 are given the same numerals.

In FIG. 6, three further magnetic field sensors are provided, including one sensor 81 located substantially midway along the cross piece 14 of the U-shaped body 10, effectively at the location of the mid-point 63 identified in the arrangement with six sensors shown in FIG. 3. Also, there is a further sensor 82 and 83 located at the end of each of the arms 11 and 12 of the U-shaped body on opposite sides of the open end 13 of the body. Each of the three further sensors 81, 82 and 83 is orientated to have its axis of sensitivity in the plane of the opening and also substantially normal to the plane of symmetry 33. As shown in FIG. 6, the direction of sensitivity for the further sensor 81 is indicated by the arrow 84 and opposes the directions of sensitivity of the sensors 82 and 83, as shown by the arrows 85 and 86 respectively.

In order to obtain the requirement for the summation $$\sum_{r=1}^{n} c_r h_r = 0$$

for uniform external fields, either the sensitivity of the sensors 82 and 83 are set to be half the sensitivity of sensor 81, or the factor $c_r$ for the sensors 82 and 83 is set to be half the factor $c_r$ for sensor 81.

Within these constraints, the factors $c_r$ for the three further sensors can be different from the common factor $c_r$ for the corner sensors 41 42, 21 22 and also from the factor for the mid-point sensors 43 and 44. Values for the factors $c_r$ for the nine sensors can be determined as before by performing line integral calculations over a predetermined line segment for each sensor in a model field corresponding to the field generated by current flowing in the conductor 19 and no external fields.

FIG. 6 also illustrates a probe with still further sensors to provide even greater accuracy and rejection of external magnetic fields. Thus, there may be a total of thirteen sensors in the U-shaped body 10 of the probe including four still further sensors 90, 91, 92 and 93, each located at a respective mid-point along an arm of the U-shaped body between an existing mid-point sensor 43 or 44 and a respective corner sensor 42, 22, 21 and 41. Again, these four still further sensors 90, 91, 92 and 93 are located on the minimum length loop 60 and orientated to have axes of sensitivity in the plane of the opening. Preferably, the axes of sensitivity of these still further sensors 90, 91, 92 and 93 are also orientated parallel to the plane of symmetry 33, so as to extend as shown by the arrows in FIG. 6 substantially along the minimum length loop 60.

In order to maintain the summation $$\sum_{r=1}^{n} c_r h_r = 0$$

for uniform external fields, the values of $c_r$ for each of the still further sensors 90, 91, 92 and 93 should be the same, assuming each sensor has the same sensitivity. Again the common value of $c_r$ for these four still further sensors may be selected relative to the values of $c_r$ for the mid-point sensors 43 and 44, and for the corner sensors 41, 42, 21 and 22, by performing the line integral calculations described previously.

Figure 7:
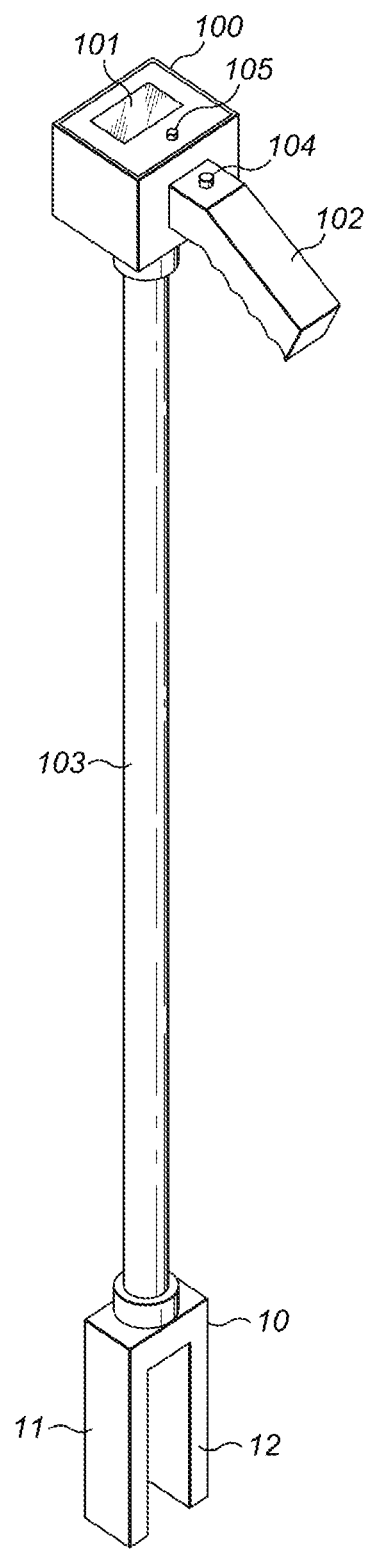
FIG. 7 is a hand-held current probe embodying the present invention.

FIG. 7 illustrates a practical hand carried current probe incorporating the U-shaped body with magnetic sensors distributed as described in the previous embodiments. In the Figure, the current probe instrument comprises the U-shaped body 10 which may be as illustrated in FIG. 1, 2, 3 or 6. The instrument includes a housing 100 which contains a measured current display 101 which is connected to sensing circuitry within the housing 100. The housing 100 with display 101 corresponds to the housing 26 illustrated in FIG. 2 including the display 101 connected to the sensing circuitry 25. A handle 102 is fixed to the housing 100 and a tube 103 connects the U-shaped body 10 to the housing 100. Connection cables can run inside the tube 103 to connect the sensors on the U-shaped body 10 to the sensing circuitry 25 within the housing 100. Generally, the instrument shown in FIG. 7 can be battery operated so the housing 100 includes a battery compartment which is not shown in the drawing.

The instrument can be operated by an operator holding the handle 102 and standing above an array of bus bars carrying currents to be measured. The operator locates the arms 11 and 12 over a bus bar to be monitored, slides the U-shaped body 10 down onto the bus bar and can then measure the current by pressing a button 104 on the handle 102 of the instrument. The sensing circuitry 25 is arranged to respond to pressing the button 104 by recording the output signals of the sensors in the U-shaped body, performing the summation $$\sum_{r=1}^{n} c_r h_r$$

as described previously and displaying the calculated current on the display 101. An indicator light 105 may be provided which is arranged to flash when the current has been taken and is recorded in a data logger contained in the sensing circuitry 25. The operator can then lift the U-shaped body 10 off the bus bar and engage the next bus bar to measure its current.

FIGS. 8 and 9 illustrate a further embodiment of the current probe. In this embodiment, a housing 110 is physically connected to U-shaped body 10. The housing 110 contains not only the sensing circuitry of the probe but also wireless signaling circuitry connected to the sensing circuitry for wireless signaling measured current values to a remote location. The housing additionally has a battery compartment 111 for a battery to power the sensing circuitry and the wireless signaling circuitry.

As shown in FIGS. 8 and 9, the probe is formed as a unitary structure incorporating the U-shaped body 10 and the housing 110 with the battery compartment 111. The housing and the battery compartment may be integral with the cross piece 14 of the U-shaped body.

The wireless signaling circuitry is illustrated in FIG. 9 by the box 112 shown connected to box 25 containing the sensing circuitry. The wireless signaling circuitry may be constituted by Wi-Fi circuitry using standard Wi-Fi protocols, so that the probe can be networked in a computer network.

The embodiments shown in FIGS. 8 and 9 permits a Wi-Fi enabled current probe as illustrated to be located on each of the anode bus bars of an electrowinning tank in an electrowinning insulation, that is to say there would be fifty-one such wireless enabled probes engaged with respective anode bus bars on a tank comprising fifty-one anodes and fifty cathodes. In a real installation there may be multiple rows of anodes and cathodes, for example eight rows each comprising fifty-one anodes and fifty cathodes. In order to monitor all the cathodes in the installation, this implies over four hundred individual Wi-Fi channels to be monitored. Ethernet gateway systems may be provided, each capable of monitoring a hundred Wi-Fi channels and providing these channels over an Ethernet connection to an Ethernet router, in turn connected to a computer system running the monitoring software. In this way a system can be devised enabling the currents in every one of the anodes of a substantial electrowinning installation to be monitored substantially in real time by a computer at a remote location. The monitoring computer itself may be connected to a further remote location by internet.

It will be understood by those experienced in the art of electrowinning, that the electrodes of an electrowinning tank must be removed regularly for processing and cleaning. In order to accommodate this, the wireless enabled current monitoring probes are made to be readily removable from the respective bus bars. As shown in FIG. 8, the arms 11 and 12 of the U-shaped body 10 of the probe have parallel internal faces providing a predetermined uniform spacing which is sized to accommodate a rectangular section bus bar engaged by the probe. At least one compression tab 115 is located on the internal face 113 of at least one of the arms. The tab 115 protrudes inwards from the internal face 113 and is adapted to be resiliently outwardly compressible on engagement with the bus bar. In the illustrated example, a second resilient tab 116 is provided on the opposite internal face 114. These resilient tabs 115 and 116 enable the probe to be slid over the bus bar, causing the tabs 115 and 116 to move outwardly when engaging the sides of the bus bar, so that when the probe is fully engaged over the bus bar, the tabs 115 and 116 apply a resilient force to the sides of the bus bar which will secure the probe in position. However, the probe can readily be removed again from the bus bar. Depressions 117 may be formed as illustrated at an upper part on opposite sides of the probe, to enable the probe to be gripped readily by the fingers of an operator to assist in removal from the bus bar.

Generally, the U-shaped body of the probes described above should be made of an electrically insulating material, at least where the probe is to be in contact with the bus bar whose current is to be measured. In practice, it is convenient to form the entire unitary body of the probes such as illustrated in FIGS. 8 and 9 of an electrically insulating plastics material.

Figure 10:
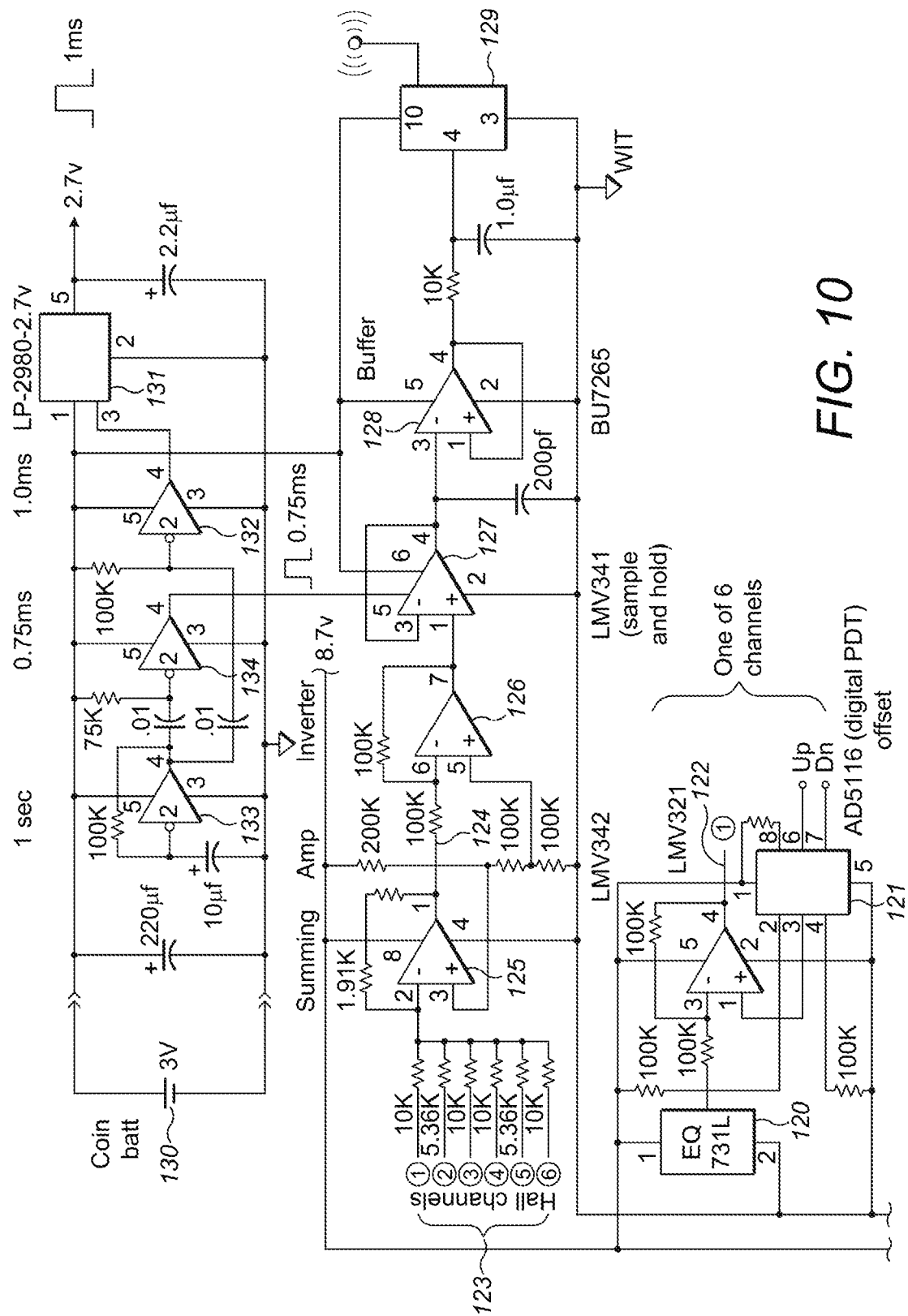
FIG. 10 is a schematic circuit diagram illustrating the sensing circuitry and wireless circuitry which may be incorporated in a wireless enabled current probe as illustrated in FIGS. 8 and 9.

FIG. 10 is a schematic diagram of the circuitry 25, 112, which is incorporated in the wireless enabled probe shown in FIGS. 8 and 9. In the circuit of FIG. 10, each of the Hall sensors of the probe is represented by the device 120, which in the illustrated example is a linear Hall IC, Part No. EQ-731L, manufactured by AKM (Asahi Kasei Microdevices). The Hall devices used in each probe are presorted to provide at least 1% sensitivity matching. Each Hall IC has an offset voltage which is adjusted out using an operational amplifier circuit incorporating a digital potentiometer 121, such as device AD5116 made by Analogue Devices. The resulting circuitry provides a sensor output voltage on line 122 which is a measure of the magnetic field intensity aligned with the axis of sensitivity of the device 120. For the current probe with six magnetic field sensors, the circuitry shown in FIG. 10 containing the device 120 and the Op amp circuitry including the digital potentiometer 121 is repeated six times, one for each of the Hall devices.

The six sensor outputs on respective lines 122 are then supplied to the summing inputs 123 of the summing amplifier containing operational amplifier 125. The input resistances shown in the six summing inputs of the summing amplifier are selected to apply the relative values $c_1$ to $c_6$ for the six magnetic field sensors, so that the output of the summing amplifier on line 124 from op amp 125 represents $$\sum_{r=1}^{6} c_r h_r.$$

This summed magnetic field sensor value is inverted by op amp 126, sampled by op amp 127 and then buffered by buffer amp 128 for supply to a sense input of a wireless sensor device indicated by the box 129. The wireless sensor device used in the example is an analogue voltage sensing device made by Monnit Corporation which can be interfaced in a wireless network to transmit the sensed voltage value (representing the magnetic field sensor summation) to a remote location.

Figure 11:
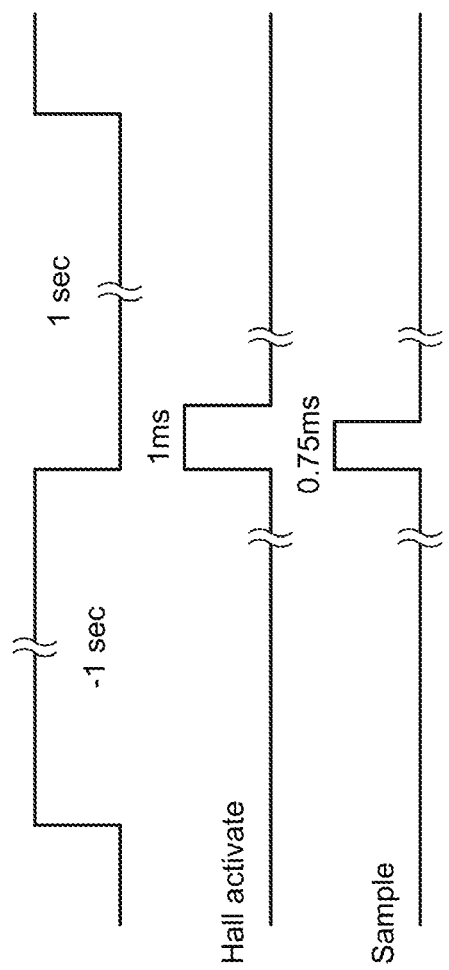
FIG. 11 is a timing diagram for the circuit of FIG. 10.

The circuitry of FIG. 10 is powered by a coin battery shown at 130 via a switched regulator module 131, such as LP-2980 made by Texas Instruments. The unregulated voltage from the battery 130 is supplied to maintain power to the sample and hold op amp 127 and buffer amp 128, and also the wireless sensor module 129. The regulated output from voltage regulator 131 is controlled by a pulse generator incorporating bi-stable circuit 132, producing pulses of duration 1 mS. The bi-stable 132 is itself triggered by a bi-stable 133, connected with a timing RC circuit to cycle between states every one second, so that the 1 mS pulses from the bi-stable 132 are produced once every two seconds. A further bi-stable circuit 134 is connected to produce pulses of length 0.75 mS, to clock the sample and hold circuit 127. With this arrangement, the Hall devices and summing amplifier are powered for brief periods of 1 mS every two seconds during which the summed sensor value is captured by the sample and hold circuit 127 for buffering and subsequent wireless transmission by the wireless module 129. FIG. 11 is the timing diagram for the circuit.

It will be understood that FIG. 10 is only an example of circuits which may be used for determining and summing the magnetic field sensor outputs and, in the wireless enabled embodiment, for transmitting these wirelessly to a remote location. A similar functionality may be achieved using a microprocessor, enabling program controlled sensitivity calibration and offset adjustment.

When the wireless enabled current probe embodiment described with reference to FIGS. 8, 9 and 10 is used in a wireless network, suitable wireless routers and also network monitoring software may also be used as provided by Monnit Corporation. In order to reduce battery consumption for the circuitry of the wireless enabled current probe, the networking and monitoring software can be set to provide a "heartbeat" which activates the wireless circuitry in each current sensor probe only periodically, for example once every hour, and for just long enough to complete a wireless transaction supplying the currently buffered magnetic field sensor summation value.

In summary, an example of the invention provides a method of measuring direct current flowing in a conductor which has minimum and maximum orthogonal cross-sectional dimensions. In the method, an Ampere's Law integration path is effectively defined around the conductor. The integration path is perpendicular to a central line of the conductors and the path has minimum and maximum orthogonal dimensions which exceed the dimensions of the conductor. A respective angle component of magnetic field is then measured at each of a plurality of locations along this integration path. It is important that there is an adjacent pair of these magnetic field measuring locations at one end of the maximum dimension of the path, the locations of this pair being spaced apart by the minimum dimension of the path. There should also be a third location for the measurement which is located at the other end of the maximum dimension of the path. Referring to FIGS. 1 and 2, the Ampere's Law integration path comprises the dotted line 120 linking the measurement locations corresponding to the locations of sensors 20, 21 and 22. The minimum and maximum orthogonal dimensions of the path correspond respectively to the horizontal width and vertical height of the path 120 as illustrated in FIG. 1. The pair of locations at one end of the maximum dimension of the path 120 corresponds to the locations of the sensors 21 and 22 and the third location at the other end of the maximum dimension of the path corresponds to the location of the sensor 20.

It is then important that the locations and the orientations of the angle components which are measured are selected such that there exist values of $c_r$ for which in any homogeneous magnetic field $$\sum_{r=1}^{n} c_r h_r = 0$$

where n is the number of said locations, $h_r$ is the measured value of the magnetic field component at the $r^{th}$ location and $c_r$ is a constant factor for the $r^{th}$ location. Then, the measured values of $h_r$ can be combined to produce a value for the direct current to be measured.

Figure 12:
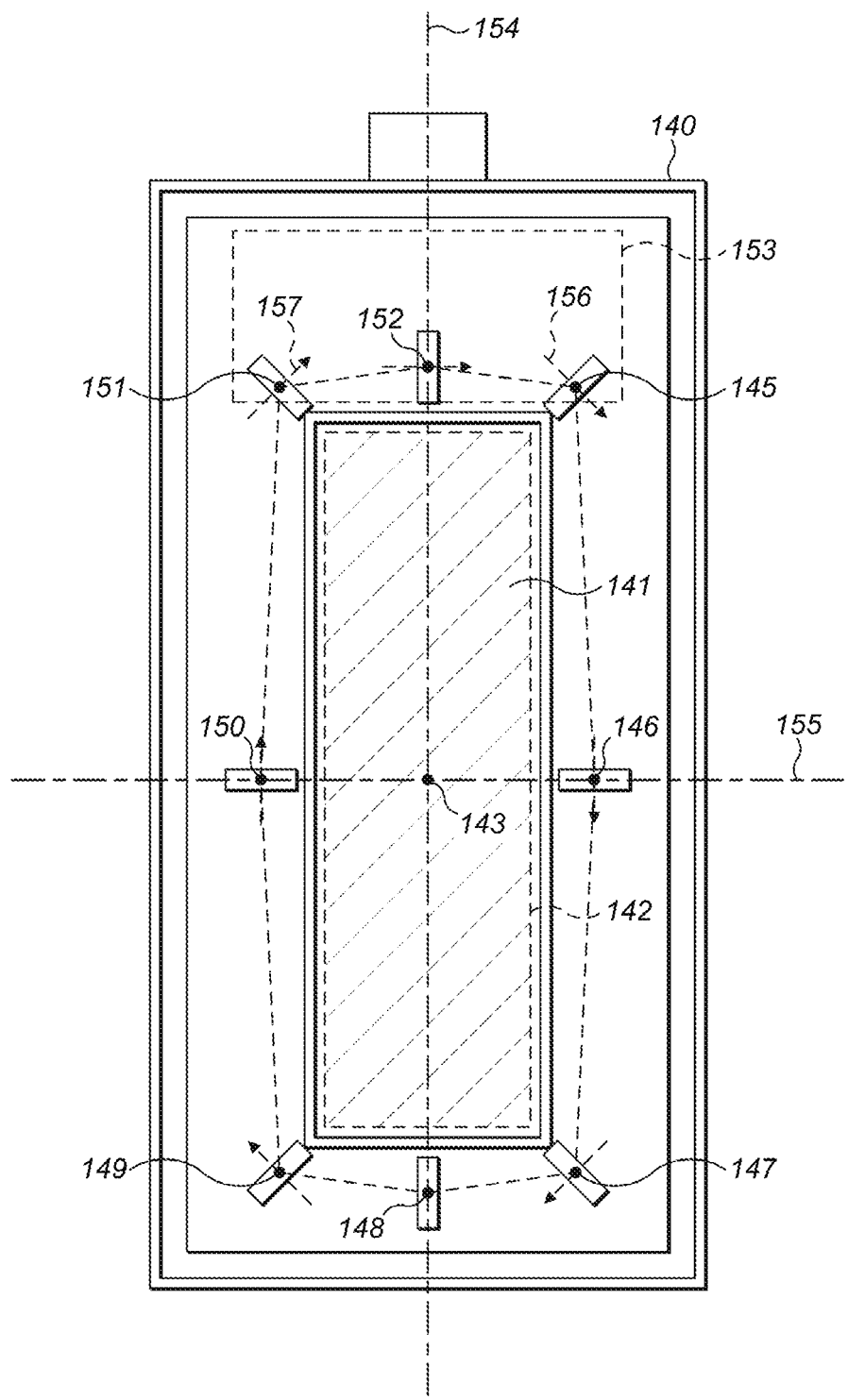
FIG. 12 illustrates further examples of current probe embodying the present invention where the probe body is closed.

Further examples and embodiments of the invention will now be described with particular reference to FIGS. 12 and 13. In FIG. 12, a coreless current probe is shown having a body 140 which defines an opening 141 to accommodate a conductor carrying a current to be measured. In FIG. 12, the conductor is shown in dashed outline at 142. The opening 141 extends in a plane, corresponding to the plane of the paper in the figure. A central line 143 is defined extending through the opening 141 normal to the plane of the opening. The body 140 extends fully around the conductor 142 in a closed loop and the conductor 142 is accommodated in the opening 141 of the body 140 so as to extend through the opening 141 parallel to the central line 143.

A plurality of coreless single point magnetic field sensors are distributed in said body 140 around the opening 141. In FIG. 12, a total of eight such sensors 145 to 152 are shown, but embodiments of the invention may have fewer such sensors, to a minimum of three sensors, or more such sensors.

It should be noted in FIG. 12 that there are respective linear spacings between the sensors 145 to 152 as distributed around the opening. These linear spacings are denoted by dotted lines extending between the centres of adjacent sensors around the opening. It should further be noted that the linear spacings between adjacent sensors is not uniform around the opening so that for example the spacing between adjacent sensors 145 and 146 is different from the spacing between sensors 152 and 145.

The single point magnetic field sensors 145 to 152 can be any type of sensor which is capable of producing an electrical signal representing the intensity of magnetic field at the location of the sensor. The magnetic field sensors employed in this embodiment are vector magnetometers, in the sense that each of the sensors has a respective axis of magnetic field sensitivity. The preferred form of sensor is a Hall effect sensor. An alternative form of sensor is a magneto resistive device.

In the illustrated example, the respective axis of magnetic field sensitivity for each of the sensors 145-151 is illustrated by a respective arrow extending through the centre of the sensor. In order to detect magnetic field generated by current flowing in conductor 142, the axis of magnetic field sensitivity of each of the sensors 145 to 152 is not aligned in a plane containing the central line 143.

As with previous embodiments, the distribution of the sensors 145 to 152 permits the summation $$\sum_{r=1}^{n} c_r h_r = 0$$

to be true in any homogeneous magnetic field.

Sensing circuitry is provided, in the present embodiment mounted within the housing of the body 140, and is operative to produce for each of the sensors 145 to 152 a respective sensor signal which is a measure of the angle component of magnetic field at the respective sensor aligned with the respective axis of magnetic field sensitivity of the sensor. The sensing circuitry 143 is also operative to combine these measures $h_r$, employing the summation $$\sum_{r=1}^{n} c_r h_r,$$

to produce a measured current value representing current flowing in conductor 142.

Importantly, the sensing circuitry applies selected values of $c_r$ for the summation, and not all values of $c_r$ in the summation are the same. This distinguishes the embodiment from prior art arrangements using a circularly symmetric array of Hall effect sensors which are evenly spaced, and in which sensor outputs are simply summed with no relative weighting.

Although the embodiment illustrated in FIG. 12, contains eight sensors 145 to 152, the requirements (a) that the sensors should not be all equally spaced around the opening in the sensor body, (b) that there are values $c_r$ for which the summation $$\sum_{r=1}^{n} c_r h_r = 0$$

in any homogenous magnetic field, and (c) that the summation $$\sum_{r=1}^{n} c_r h_r$$

produces said measured current value, can be met with just three sensors, for example sensors 152, 147 and 149 in the arrangement of FIG. 12. It may be noted that this arrangement of sensors corresponds to the arrangement described above with respect to FIG. 1, except that the body 140 of FIG. 12 is closed to surround the conductor 142, instead of being in the form of an open U-shape as in FIG. 1.

In the embodiment of FIG. 12, the conductor 142 has an elongate cross-section, in particular in this example a rectangular cross-section as illustrated. The opening 141 in the body 140 of the illustrated probe is also rectangular and elongate in section to accommodate the conductor. In FIG. 12, a dashed line 154 extends through the central line 143 along the length of the opening 141, and a dashed line 155 extends through the central line 143 across the width of the opening.

Although the example of probe shown in FIG. 12 has eight sensors, in another example, only six sensors may be provided, corresponding to sensors 145, 146, 147, 149, 150 and 151 in FIG. 12. These six sensors comprise a first pair of sensors 145 and 151 at one end of the length of the opening 141, a second pair of sensors 147 and 149 at the other end of the length of the opening, and a third pair of sensors 146 and 150 located substantially midway along the length of the opening.

The sensors of each of the first, second and third pairs of sensors are disposed spaced symmetrically on opposite sides of a plane of symmetry containing the central line 143 and parallel with the length of the opening This plane effectively corresponds with the dashed line 154 in FIG. 12. It should be noted that each of the sensors of the first, second and third pairs of sensors is orientated in the body 140 to have its respective axis of sensitivity in a plane perpendicular to the central line. Further, the sensors 145, 147, 149 and 151 of the first and second pairs of sensors have their axes of sensitivity at respective acute angles to the plane of symmetry 154, so as to be generally tangential to the opening 141. By arranging the axes of sensitivity to be generally tangential to the opening, these axes will be generally aligned (though not necessarily precisely) with the direction of the magnetic field that is generated by current flowing in the conductor 142. In the embodiment described with six sensors, the sensors of the third pair of sensors have their axes of sensitivity parallel to the plane of symmetry 154.

As may be observed in FIG. 12, the length of the opening 142 is not less than twice the width of the opening, and is in fact somewhat greater than twice the width. As a result, when the sensors 146 and 150 of the third pair of sensors is located midway along the length of the opening, effectively on the line 155 shown in FIG. 12, the spacing between each of the sensors 146, 150 of the third pair of sensors and an adjacent sensor of the first or second pair of sensors, for example the spacing between sensors 145 and 146 on the same side of the plane of symmetry, is greater than the spacing apart of the sensors 145 and 151 of the first pair of sensors.

It is desirable also that the sensing circuitry 153 is adapted such that the selected values of $c_r$ for the sensors 146 and 150 of the third pair of sensors are greater than the selected values $c_r$ for the sensors 145, 151, 147 and 149 of the first and second pair of sensors.

The above described example with just six sensors, corresponding to sensors 145, 146, 147, 149, 150 and 151 in FIG. 12, corresponds to the arrangement described above with respect to FIG. 3, again except that the body 140 of FIG. 12 is closed to surround the conductor 142, instead of being in the form of an open U-shape as in FIG. 3.

It should be noted also that the sensors as illustrated in FIG. 12 are distributed in the body 140 around the opening 141 such that the sensors are not all located in a common cylindrical surface having the central line 143 as its axis. In particular, in the arrangement with just six sensors corresponding to sensors 145, 146, 147, 149, 150 and 151, as described above, the sensors 145, 147, 149 and 151, at the corners of the opening 141 may be regarded to lie on a common cylindrical surface with the central line 143 as its axis. However, the two sensors 146 and 150 of the third pair of sensors, located generally midway along the length of the opening, are not located on the same cylindrical surface containing the corner sensors.

In other embodiments, the spacing of adjacent sensors around the opening in the probe may be uniform, so long as the sensors do not all lie on the same cylindrical surface having the central line 143 as its axis.

As discussed previously, the value $c_r$ for the eight sensors in the probe illustrated in FIG. 12 are selected so that, in any homogeneous field, the sum of the products $c_r h_r$ of all the sensors in the probe is zero. In this way, the probe is insensitive to external homogeneous fields. It should be understood that the individual sensors 145 to 152 may have the same nominal sensitivity however, any actual variation in sensitivity between individual sensors in the probe may be compensated in the sensing circuitry by a compensation factor $a_r$ for the $r^{th}$ sensor, where $h_r = a_r v_r$, $v_r$ being the actual output signal from the $r^{th}$ sensor responsive to a magnetic field $h_r$ aligned with the axis of sensitivity of the sensor. Accordingly, the total factor modifying the output signal $v_r$ of each sensor is $c_r a_r$.

In FIG. 12, sensors 145 and 151 may be considered as a first symmetrical pair of sensors located and orientated in the body 140 of the probe symmetrically with respect to a first plane of symmetry containing the central line 143. This first plane of symmetry is indicated by the dashed line 154. Then, the values of $c_r$ for the sensors 145 and 151 of this first symmetrical pair of sensors are selected such that, in a uniform magnetic field directed to link these sensors 145 and 151, the sum of the values $c_r h_r$ for the sensors 145 and 151 is zero. As a result, the values $c_r$ for sensors 145 and 151 have a fixed relationship. If, as shown in FIG. 12, the sensors 145 and 151 have their respective axes of sensitivity at equal and opposite acute angles to the first plane of symmetry 154, then the values of $|c_r|$ for the two sensors 145 and 151 are the same. In the cases illustrated in FIG. 12, where the sensitivity vectors 156 and 157 of the two sensors are aligned in the same direction of rotation around the central line 143, then the values $c_r$ should be the same.

In the arrangement of FIG. 12, there is a second symmetrical pair of sensors 147 and 149 at the other end of the length of the opening 141 in the probe body, which are also symmetrical in location and orientation with respect to the first plane of symmetry 154. The sensors of this second symmetrical pair are at equal and opposite acute angles to the sensors 145, 151 of the first symmetrical pair. Again the values $c_r$ for the sensors of the second symmetrical pair are selected such that, in a uniform magnetic field linking the second symmetrical pair of sensors, the sum of the values $c_r h_r$ for the second symmetrical pair of sensors is zero. Also, the values $c_r$ for the second symmetrical pair of sensors are set so that, in any homogeneous magnetic field, the sum of the values $c_r h_r$ for all the sensors of the first and second symmetrical pairs of sensors, i.e. sensors 145, 151, 147 and 149, is zero. Then, values of $c_r$ for the first and second symmetrical pairs of sensors must also have a fixed relationship with each other.

In the example shown in FIG. 12, the first symmetrical pair of sensors 145 and 151, and the second symmetrical pair of sensors 147 and 149, are also symmetrically located and orientated with respect to a second plane of symmetry containing the central line and at right angles to the first plane of symmetry 154. The second plane of symmetry is indicated in the Figure by the dashed line 155. With this double symmetry between the sensors 145, 151, 147 and 149, the values $|c_r|$ for all four sensors should be the same. Again, if the vector direction of sensitivity of the sensors 147 and 149 are also in the same rotational direction around the central line 143 as the sensitivity vectors 156 and 157 of the sensors 145 and 151, then $c_r$ for all four sensors should be the same.

The embodiment of FIG. 12 includes a third symmetrical pair of sensors 146 and 150 located symmetrically with respect to the first plane of symmetry 154. The axes of sensitivity of the sensors 146 and 150 of this third symmetrical pair are both aligned parallel to the first plane of symmetry and the values $c_r$ for the sensors 146 and 150 are selected such that in any homogeneous field the sum of the values $c_r h_r$ for the sensors 146 and 150 is zero. As a result, the values of $c_r$ for the third symmetrical pair of sensors 146 and 150 have a further fixed relationship. Notably, the fixed relationship of the values $c_r$ for the sensors 146 and 150 is different from the fixed relationship of the sensors 145, 151 and 147, 149 of the first and second pairs of sensors. Also it should be noted that the requirement for the sum of the values $c_r h_r$ for all six of the sensors of the first, second and third pairs of sensors, that is sensors 145, 146, 147, 149, 150 and 151, to be zero in any homogeneous magnetic field can be met without there being any fixed relationship between either of the sensors 146 and 150 of the third symmetrical pair of sensors and any of the sensors 145, 147, 149 and 151 of the first and second symmetrical pairs of sensors. Accordingly, this arrangement of six sensors distributed around the opening 141 of the probe shown in FIG. 12 provides "a degree of freedom" in the setting of the values $c_r$, even with the requirement that the sum of the values $c_r h_r$ for the six sensors should be zero.

A corresponding "degree of freedom" in the setting of the value $c_r$ can be achieved in an example of probe comprising only the symmetrical pair of sensors 146 and 150 having their axes of sensitivity aligned parallel with the first plane of symmetry 154, together with a further symmetrical pair of sensors 148 and 152, which are located symmetrically with respect to the second plane of symmetry 155 and have their respective axes of sensitivity aligned parallel with the second plane of symmetry 155. Such a probe with just the four sensors 146, 150, 148 and 152 illustrates a further embodiment of the invention.

As before, the values $c_r$ for the symmetrical pair of sensors 146 and 150 are selected so that the sum of the values $c_r h_r$ for these two sensors is zero in any homogeneous magnetic field. This has the effect that the value $|c_r|$ for the sensors 146 and 150 should be the same. Where, as shown in FIG. 12, the sensitivity vectors for the sensors 146 and 150 are in the same direction of rotation around the central line 143, the values $c_r$ for these two sensors are in fact the same. Similarly, the value $|c_r|$ for the further symmetrical pair of sensors 148 and 152 should be the same, and where the sensitivity vectors of these sensors 148 and 152 are directed in the same rotational direction around the central line 143, the values $c_r$ for these two sensors 148 and 152 are the same. However, it can be seen that the overall requirement for the sum of the values $c_r h_r$ for the four sensors 146, 148, 150 and 152 to be zero in any homogeneous magnetic field does not require any fixed relationship between a common $c_r$ value of the symmetrical sensors 146 and 150 and the common $c_r$ value for the symmetrical sensors 148 and 152. Accordingly there is a degree of freedom in the setting of the values $c_r$.

In the arrangement of eight sensors as illustrated in FIG. 12, there are in fact two degrees of freedom, that is one degree of freedom between the related values of $c_r$ for the corner sensors 146, 147, 149 and 151, the related values of $c_r$ for the symmetrical sensors 146 and 150, and a second degree of freedom between the related values for the corner sensors and the related values of $c_r$ for the symmetrical sensors 148 and 152.

As will become apparent later herein, these degrees of freedom in the setting the values $c_r$ for the single point field sensors of examples of current probe embodying the present invention can be useful in improving the ability of the probe to reject external magnetic fields which are not produced by currents in the conductor 142 engaged by the probe.

The embodiments of FIG. 12 have been described above as an example of probe in which the sensors are not all located on a common cylindrical surface which has the central line 143 as its axis. In particular, the sensors 146 and 150 in the example of FIG. 12 are not on the same cylindrical surface as the corner sensors 145, 147, 149 and 151. Further the sensors 146 and 150 are not on the same cylindrical surface as the sensors 148 and 152. Embodiments with a U-shaped sensor body as described previously may also exhibit this feature. For example, the embodiment illustrated in FIG. 3 includes sensors 43 and 44 which are not on the same cylindrical surface as the sensors 21, 22, 41 and 42. It should be noted also that the embodiment of FIG. 3 exhibits a degree of freedom between the related values of $c_r$ for the symmetrical sensors 43 and 44 and the related values of $c_r$ for the corner sensors 21, 22, 41 and 42.

Considering the U-shaped body embodiment illustrated in FIG. 6, the symmetrical sensors 43 and 44 are again not on the same cylindrical surface as the corner sensors 21, 22, 41 and 42. In addition, in the FIG. 6 arrangement with thirteen sensors, the intermediate symmetrical sensors 90 and 93, and 91 and 92 are not on the same cylindrical surface with respect to the central line 18 as either the central sensors 43 and 44, or the corner sensors 21, 22, 41 and 42.

Referring again to FIG. 6, a further embodiment of the invention with a U-shaped body as illustrated may have just five sensors. These five sensors may include first symmetrical pair of sensors 43 and 44 which are symmetrically located and orientated with respect to a plane of symmetry corresponding to line 33, containing the central line 18. The sensors 43 and 44 have their sensitivity vectors parallel to the plane of symmetry 33 and the values $c_r$ for these two sensors are equal so that the sum of the values $c_r h_r$ for these two sensors is zero in any homogeneous field.

In addition the probe has a further symmetrical pair of sensors 82 and 83 located at the open end 13 of the U-shaped body of the probe, symmetrically with respect to the plane of symmetry 33, and also a further single sensor 81 located on the cross piece 14 of the body of the probe. The axes of sensitivity of the three sensors 81, 82 and 83 are all aligned normal to the plane of symmetry 33 and the values of $c_r$ for the three sensors are selected such that the sum of the values $c_r h_r$ for the three sensors is zero in any homogeneous magnetic field. As a result, the values of $c_r$ for these three sensors 81, 82 and 83 have a fixed relationship with each other. In practice, assuming the sensitivity vectors of the three sensors 81, 82 and 83 have the same rotational direction around the central line 18, the values of $c_r$ for each of the sensors 82 and 83 at the open end of the U-shape body should be half of the value of $c_r$ for the sensor 81 on the cross piece 14 at the closed end of the body. With this arrangement of five sensors, it can be seen that there is a degree of freedom between the value of $c_r$ for the two central sensors 43 and 44, and the related values of $c_r$ for the sensors 81, 82 and 83.

In another embodiment, the probe may comprise, in addition to the five sensors 43, 44, 81, 82 and 83, the four corner sensors 21, 22, 41 and 42 illustrated in FIG. 6, providing a total of nine sensors. In this arrangement with nine sensors, two degrees of freedom are provided amongst the values of $c_r$, a first degree of freedom between the value of $c_r$ for the central sensors 43 and 44 and the related values of $c_r$ for the sensors 81, 82 and 83, and a second degree of freedom between the value for the central sensors 43 and 44 and the common value of $c_r$ for the corner sensors 21, 22, 41 and 42. If the further four sensors 90, 91, 92 and 93 illustrated in FIG. 6 are included in the embodiment, providing a total of thirteen sensors, then there may be a third degree of freedom in the setting of the values $c_r$.

As explained previously, the available degrees of freedom for setting the value $c_r$ in the summation $$\sum_{r=1}^{n} c_r h_r$$

to provide a value for the current flowing in the conductor engaged by the probe can be exploited to reduce or minimize the response of the probe to external magnetic fields which are not produced by currents in a conductor engaged by the probe. It will be understood by the skilled person that the line integral of the magnetic field in a closed loop around a conductor carrying a current provides a measure of current in the conductor. However, when using point magnetic field sensors, such as Hall devices, distributed at intervals along a closed path around the conductor, the sum of the magnetic field components measured by these sensors can provide only an approximation of the precise line integral value. This presents a problem with the accuracy of measurement of current in environments where external magnetic fields are substantial and not constant.

In a basic example current flowing in a conductor is measured by measuring the respective angle component of magnetic field at each of a plurality of locations distributed around the conductor. The locations and the orientations of the components are selected so that there are values of $c_r$ for which in any homogeneous field $$\sum_{r=1}^{n} c_r h_r = 0.$$

The measured values $h_r$ are combined using the summation $$\sum_{r=1}^{n} c_r h_r$$

with selected values of $c_r$ to produce a value for the current in the conductor. Importantly at least one value of $c_r$ in the summation is different from other values of $c_r$.

Considering the example illustrated in FIG. 12, the sensors 145 to 152 can be considered divided into the groups of sensors providing corresponding sets of measured angle components of magnetic field. A first set of measured angle components may be constituted by the measured angle components of the corner sensors 145, 147, 149 and 151. This set of measured angle components has a first mutual symmetry centered around the central line 143 of the conductor. The values of $c_r$ for this first set of measured components constitute a first set of values which have a first fixed relationship in order that the sum of the value $c_r h_r$ for this first set of measured components is zero in any homogeneous magnetic field. In a particular example of FIG. 12, values of $c_r$ for the measured components of the first set of components are equal to each other.

The sensors 146 and 150 can then be considered to constitute a second group of sensors providing a corresponding second set of measured angle components which have a second mutual symmetry centered around the central line 143. The values of $c_r$ for this second set of measured components constitute a second set of values which have a fixed relationship in order that the sum of the values $c_r h_r$ for the measured components of this second set is zero in any homogeneous magnetic field. In the case illustrated in FIG. 12, the values of $c_r$ for the measured components from the sensors 146 and 150 are equal, but need have no fixed relationship with the values of $c_r$ for the first set of measured components from the first set of sensors.

Thus, in the example of FIG. 12, the sensors provide at least two sets of measured components for which the values $c_r$ have a degree of freedom and can be mutually variable, without comprising the requirement that the sum of the value $c_r h_r$ for all measured components should be zero in any homogeneous magnetic field.

In order to optimize the sensor of FIG. 12 to measure currents in conductors having multiple physical configurations resulting in multiple magnetic field configurations, a respective computer model should be provided of at least a selection of the multiple possible magnetic field configurations. In each case the computer model assumes the same predetermined current flowing in the conductor, but the physical configuration of the conductor in relation to other magnetic bodies, or in relation to other magnetic field generating elements, is different for each of the magnetic field configuration models.

For example, in an example such as illustrated and described above*with reference to FIG. 4, the bus bars 75*a-f* are arranged to be parallel which each other in quite close proximity. The first magnetic field configuration for an individual bus bar may be considered to be the magnetic field generated by current flowing in a single bus bar with no substantial external magnetic field components. This may be regarded as a reference configuration of magnetic field.

A second configuration of magnetic field may be considered the magnetic field resulting from equal currents flowing not only in the target bus bar of which the current is to be measured, but also in an immediately neighboring bus bar and a next but one bus bar. A third configuration may be considered as the magnetic field generated by current flowing in the target bus bar, a similar current flowing in the next but one bus bar and zero current flowing in the immediately neighbouring bus bar. A fourth configuration may be considered to be a magnetic field generated by equal currents flowing not only in the target bus bar but also in the immediate neighboring and next one bus bars, together with a plate of magnetic material, e.g. a steel plate, located adjacent to the target bus bar. Such configurations may be typical of the possible physical configurations and corresponding magnetic field configurations occurring in the electrowinning tank embodiment illustrated in FIG. 4.

As mentioned above, a computer model is provided of each of the above typical magnetic field configurations. In the case of each model, the same current is flowing through the target conductor. Then, each of these models is used to calculate for each of the selected magnetic field configurations the respective angle components of magnetic field at the plurality of locations. In the FIG. 12 embodiment, these could be the angle components measured by each of the sensors 145 to 152.

The summations $$\sum_{r=1}^{n} c_r h_r$$

are then calculates for each of the selected magnetic field configurations using the first and second sets of $c_r$ values having fixed relationships as discussed above. A best relationship between the first and second sets of values of $c_r$ is then selected, exploiting the degree of freedom mentioned above, which minimizes differences in the calculated summations for the different selected magnetic field configurations. This process of selecting the best relationship between the various sets of values of $c_r$ can be accomplished by setting up the measured values $h_r$ for the different configurations in tables in an Excel spreadsheet, for example, and then applying different relationships (or weightings) to the first and second sets of $c_r$ values until the percentage variation amongst the calculated summations values for the different magnetic field configurations is at a minimum. Alternatively, the process may be accomplished by a computer programmed to perform a mathematical curve-fitting operation, as will be understood by the skilled person.

In any case, because the distribution and orientation of the point sensors around the conductor provides at least one degree of freedom between $c_r$ values used in the summation $$\sum_{r=1}^{n} c_r h_r,$$

as explained above, this degree of freedom can be selected and used to improve rejection by the probe of variable external magnetic fields.

As explained previously, in the example of FIG. 12 with eight sensors, there may be two degrees of freedom in the values $c_r$, enabling an improved empirical selection of the values of $c_r$ to minimize response to external magnetic fields in a range of expected magnetic field configurations.

Figure 13:
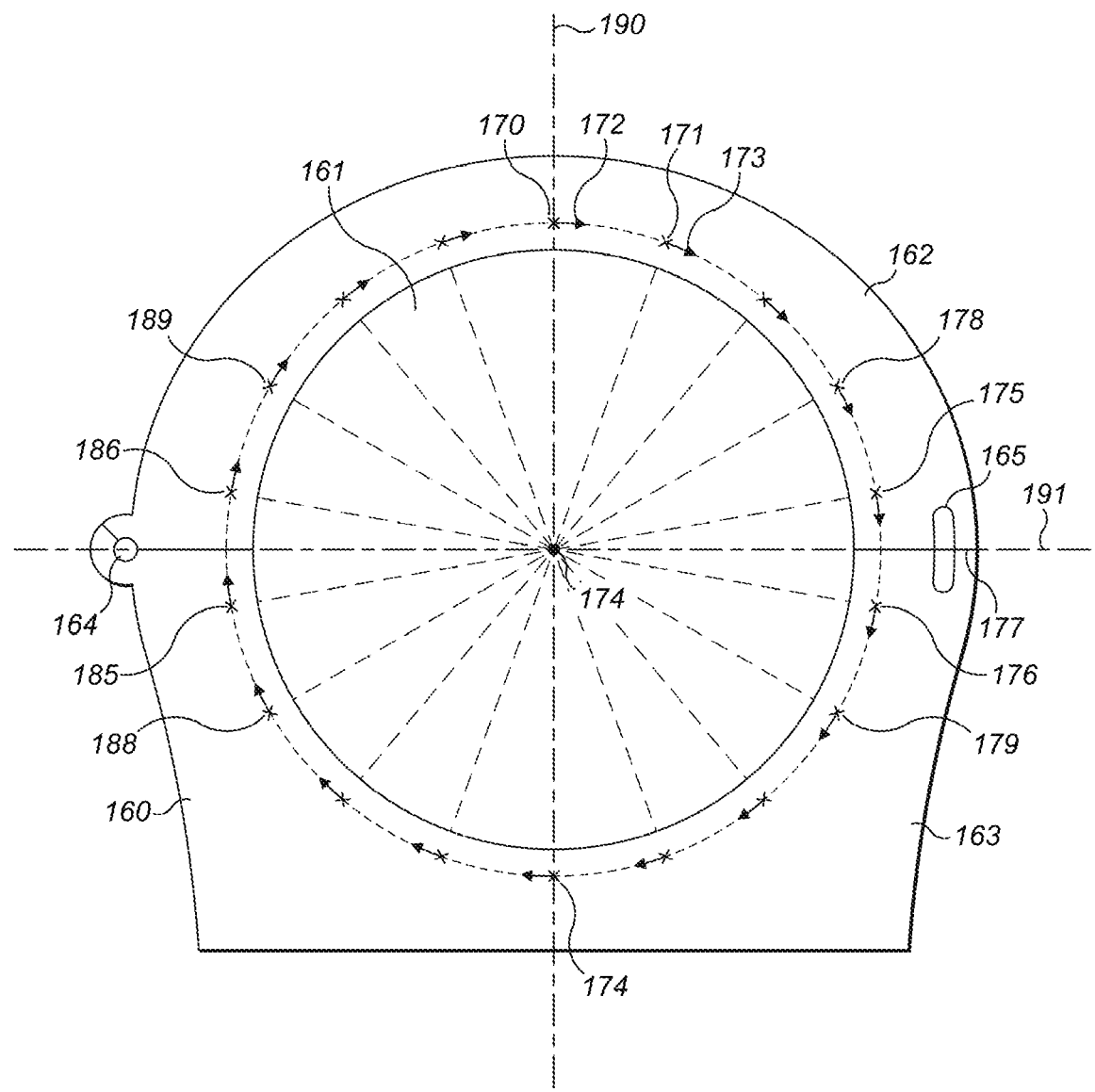
FIG. 13 illustrates a still further example of current probe embodying the present invention where the opening in the conductor is circular.

A further embodiment of the invention is shown in FIG. 13. The current probe illustrated in FIG. 13 comprises a body 160 defining a circular opening 161 to accommodate a current carrying conductor. The body 160 is split into two sections 162 and 163, which may be pivoted apart at a pivot 164 to enable the probe to be engaged around a conductor whose current is to be measured. Once the probe body 160 is engaged around the conductor the two parts 162 and 163 can be clipped together to close the body by means of a clip 165.

The probe comprises a total of eighteen single point magnetic field sensors distributed around the opening 161 of the probe. The locations of the sensors are indicated by the X markings as at 170, 171 for example. The magnetic field sensitivity vector of each of the sensors is indicated by the respective arrows 172 and 173 for example. The sensors all lie on a common circle centered on a center line 174, and the field sensitivity vectors of the sensors are directed tangentially in the same rotational direction about the centre line 174.

However, not all the sensors distributed around the opening 161 have the same spacing from immediate adjacent sensors. Given the circular arrangement of the sensors in the embodiment of FIG. 13, it is convenient to refer to the spacing between adjacent sensors by means of an angular spacing.

In the upper part 162 of the probe body the central sensor, marked 170 in FIG. 13, and the three sensors on either side of this central sensor 170 are equally spaced apart by 20°. Similarly, the central sensor 174 in the lower part 163 of the probe body together with the three sensors on each side of this central lower sensor 174 are spaced apart by 20°.

However, the adjacent sensors 175 and 176 on either side of the split 177 between the upper and lower parts 162 and 163 of the probe body are separated by each other by 12° and each of these sensors 175 and 176 is itself separated from the next neighbouring sensor, 178 and 179 respectively, by 24°.

The sensors 185 and 186 on opposite sides of the split at the pivot 164 of the body are diametrically opposed to the sensors 175 and 176, and similarly the neighbouring sensors 188 and 189 are diametrically opposed to the sensors 178 and 179 respectively. Accordingly, the sensors 185, 186, 188 and 189 have spacings corresponding to the sensors 175, 176, 178 and 179.

Considering the linear spacings between adjacent sensors distributed around the opening 161 of the body 160, it can be seen that at least one of the linear spacings is different from another of the linear spacings.

The current probe illustrated in FIG. 13 also has sensing circuitry, which is not illustrated in this drawing, generating the summation $$\sum_{r=1}^{n} c_r h_r$$

in order to provide a value for the current flowing in a conductor extending through the circular opening 161. In order to compensate for the varying linear spacings of adjacent sensors around the circular opening 161, the value $c_r$ for each of the sensors are not all equal. The values $c_r$ in the summation are selected to ensure that the summation is zero in any homogeneous magnetic field.

The sensors in the probe shown in FIG. 13 are located and orientated symmetrically about a first plane of symmetry 190 containing the central line 174 and extending vertically in the drawing and a second plane of symmetry 191 containing the central line 174 and at right angles to the first plane of symmetry. In order that the summation $$\sum_{r=1}^{n} c_r h_r$$

is zero in any homogeneous field, symmetrically located sensors are assigned a common value $c_r$. Furthermore, it can be seen that each of the topmost and bottommost sensors on the vertical plane of symmetry 190 and the two sensors on either side of each of these top and bottom sensors are spaced from neighboring sensors by the same fixed distance. It is appropriate therefore to set the values $c_r$ for all these ten sensors to be the same, in order to minimize sensitivity of the probe to variations in the geometrical configuration of magnetic field resulting, for example, from differing locations of a conductor in the opening 161 of the probe.

However, because of mechanical tolerances, the spacings between the sensors 175 and 176 and between the sensors 185 and 186, on opposite sides of the split between the parts 162 and 163 of the probe body 160, can vary. By locating these four sensors as close as possible to the split and reducing the values $c_r$ to reduce the weighting applied to the outputs of these sensors in the summation $$\sum_{r=1}^{n} c_r h_r,$$

the contribution to a measured current value from these sensors can be reduced, correspondingly to reduce any error resulting from variations in spacing. As the four sensors 175, 176, 185 and 186 are mutually symmetrical they are given a common $c_r$ value which is less than the common $c_r$ value assigned to the ten sensors mentioned above at the top and bottom of the probe.

Having reduced the weighting applied to the outputs of the four sensors on either side of the split in the probe body, it has been found desirable to apply an increase to the $c_r$ values applied to the outputs of the four sensors 178, 179, 188 and 189. Again since these four sensors are mutually symmetrical they are assigned a common $c_r$ value, but this can be set at a value which is higher than the common $c_r$ value for the ten sensors at the top and bottom of the probe, to provide compensation in the summation $$\sum_{r=1}^{n} c_r h_r$$

for the reduced weighting of the four sensors next to the split.

An empirical process can be performed to optimize the differing $c_r$ values for the sensor outputs in the probe of FIG. 13, so as to minimize sensitivity of the probe to different magnetic field configurations, resulting for example from differing locations of current carrying conductor in the circular opening 161 of the probe, or the presence of another current carrying conductor in close proximity outside the probe body. As in previously described embodiments, computer models can be calculated of a number of typical magnetic field configurations and a best fit process can be performed to optimize the selected $c_r$ values.

The probes described above and embodying the invention are useful for measuring not only direct currents but also variable and alternating currents with frequencies up to several kHz.

The foregoing detailed description has described only a few of the many forms that this invention may take. For this reason the detailed description is intended by way of illustration and not by way of limitation. It is only the following claims, including all equivalents, which are intended to define the scope of the invention.

The invention claimed is:

1. A coreless current probe comprising a body defining an opening, whereby a conductor carrying a current to be measured can be accommodated in said opening so as to extend through said opening;
at least three coreless single point magnetic field sensors distributed in or on said body around said opening such that the at least three coreless single point magnetic field sensors are co-planar or are not co-planar, said sensors each having a respective axis of magnetic field sensitivity;
and sensing circuitry connected to said sensors which is operative to produce for each of said sensors a respective sensor signal which is a measure of the angle component of magnetic field at the sensor aligned with the respective axis of magnetic field sensitivity of the sensor,
said sensors being arranged such that there are values of $c_r$ for which, in any homogeneous magnetic field and no enclosed current, $$\sum_{r=1}^{n} c_r h_r = 0,$$

where n is the number of said magnetic field sensors,
$h_r$ is said measure of said magnetic field component for the $r^{th}$ sensor, and $c_r$ is a constant factor for the $r^{th}$ sensor,
said sensing circuitry being further operative to combine said measures $h_r$ employing the summation $$\sum_{r=1}^{n} c_r h_r$$

to produce a measured current value representing current following in a conductor accommodated in said opening in said body of said probe, where at least one value of cr in said summation differs from other values of $c_r$.

2. A coreless current probe as claimed in claim 1, wherein said sensing circuitry is adapted to derive as said measured current value the summation $$\sum_{r=1}^{n} c_r h_r$$

where the values of cr are selected such that in any homogeneous magnetic field and no enclosed current $$\sum_{r=1}^{n} c_r h_r = 0,$$

thereby maximizing rejection by the probe of external magnetic fields which are not produced by currents in a conductor engaged by the probe.

3. A coreless current probe as claimed in claim 1, wherein said opening defined by said body is elongate in section to accommodate, extending along a central line through said opening, a current carrying conductor having an elongate cross-section, said opening having a length and a width, said length of said opening is not less than twice said width of said opening, and comprising at least six said sensors, including
   a) a first pair of said sensors at one end of the length of the opening,
   b) a second pair of said sensors at the other end of the length of the opening,
and c) a third pair of said sensors located substantially mid-way along said length;
   the sensors of each of said first, second and third pairs of said sensors being disposed spaced symmetrically on opposite sides of a plane of symmetry containing said central line and parallel with said length of the opening;
   each of the sensors of said first, second and third pairs of said sensors being orientated in said body to have its axis of sensitivity in a plane perpendicular to said central line;
   wherein each of the sensors of said first and second pairs of sensors has its axis of sensitivity at a respective acute angle to said plane of symmetry so as to be generally tangential to said opening, and
   each of the sensors of said third pair of sensors has its axis of sensitivity parallel to said plane of symmetry.

4. A coreless current probe as claimed in claim 3, wherein the spacing between each of said third pair of sensors and a neighbouring sensor of said first or second pair of said sensors on the same side of said plane of symmetry is greater than the spacing apart of the sensors of said first pair of said sensors,
   and said sensing circuitry is adapted such that the selected values of cr for the sensors of said third pair are greater than the selected values of cr for the sensors of said first and second pairs.

5. A coreless current probe as claimed in claim 4, wherein said body is U-shaped having arms extending along said length of said opening, an open end and a cross piece forming a closed end opposite to said open end, said opening having said width between said arms and said length from said closed end to said open end, said at least three sensors including a respective said sensor at the end of each of said arms on opposite sides of said open end of said body, and at least one said sensor at said closed end of said body.

6. A coreless current probe comprising a body defining an opening, whereby a conductor carrying a current to be measured can be accommodated in said opening so as to extend through said opening;
   at least three coreless single point magnetic field sensors distributed in or on said body around said opening such that the at least three coreless single point magnetic field sensors are co-planar or are not co-planar and with respective linear spacings between said sensors, at least one of said linear spacings being different from another of said linear spacings, said sensors each having a respective axis of magnetic field sensitivity and being arranged in said body so that each of said axes is not co-planar with said conductor;
   and sensing circuitry connected to said sensors which is operative to produce for each of said sensors a respective sensor signal which is a measure of the angle component of magnetic field at the sensor aligned with the respective axis of magnetic field sensitivity of the sensor,
   said sensors being arranged such that there are values of $c_r$ for which, in any homogeneous magnetic field and no enclosed current, $$\sum_{r=1}^{n} c_r h_r = 0,$$

where n is the number of said magnetic field sensors,
$h_r$ is said measure of said magnetic field component for the $r^{th}$ sensor,
and $c_r$ is a constant factor for the $r^{th}$ sensor,
   said sensing circuitry being further operative to combine said measures $h_r$ employing the summation $$\sum_{r=1}^{n} c_r h_r$$

to produce a measured current value representing current following in a conductor accommodated in said opening in said body of said probe, where at least one value of $c_r$ in said summation differs from other values of $c_r$.

7. A coreless current probe comprising a U-shaped body having arms, an open end, and a cross piece forming a closed end opposite to said open end, said U-shaped body defining an opening having a width between the arms and a length from said closed end to said open end, wherein said length is not less than said width, whereby a conductor carrying a current to be measured can be engaged by said body of said probe so as to extend through said opening;
   a plurality of coreless single point magnetic field sensors distributed in or on said body around said opening including a respective said sensor at an end of each of said arms on each side of said open end of said body and at least one said sensors at said closed end of said body, said sensors each having a respective axis of magnetic field sensitivity and being arranged in said body so that each of said axes is not co-planar with said conductor;
   and sensing circuitry connected to said sensors which is operative to produce for each of said sensors a respective sensor signal which is a measure of the angle component of magnetic field at the sensor aligned with the respective axis of magnetic field sensitivity of the sensor,
   said sensors being arranged such that there are values of cr for which, in any homogeneous magnetic field and no enclosed current, $$\sum_{r=1}^{n} c_r h_r = 0,$$

where n is the number of said magnetic field sensors,
   hr is said measure of said magnetic field component for the $r^{th}$ sensor,
and cr is a constant factor for the $r^{th}$ sensor,
   said sensing circuitry being further operative to combine said measures hr to produce a measured current value representing current following in a conductor engaged by said body of said probe.

8. A coreless current probe as claimed in claim 7, further including a housing containing a measured current display connected to said sensing circuitry, a handle fixed to said housing, a tube connecting said U-shaped body to said housing, and connection cables extending through said tube, whereby an operator holding said handle can engage a conductor between the arms of said body of said probe and read a measured current from said display.

9. A coreless current probe comprising a body defining an opening, whereby a conductor carrying a current to be measured can be accommodated in said opening so as to extend through said opening;
   a plurality of coreless single point magnetic field sensors distributed in or on said body around said opening such that said sensors are not all located in a common cylindrical surface;
   said sensors each having a respective axis of magnetic field sensitivity and being arranged in said body so that each of said axes is not co-planar with said conductor;
   and sensing circuitry connected to said sensors which is operative to produce for each of said sensors a respective sensor signal which is a measure of the angle component of magnetic field at the sensor aligned with the respective axis of magnetic field sensitivity of the sensor,
   said sensors being arranged such that there are values of cr for which, in any homogeneous magnetic field and no enclosed current, $$\sum_{r=1}^{n} c_r h_r = 0,$$

where n is the number of said magnetic field sensors,
   hr is said measure of said magnetic field component for the $r^{th}$ sensor,
and cr is a constant factor for the $r^{th}$ sensor,
   said sensing circuitry being further operative to combine said measures hr employing the summation $$\sum_{r=1}^{n} c_r h_r$$

to produce a measured current value representing current following in a conductor accommodated in said opening in said body of said probe, where at least one value of cr in said summation differs from other values of cr.

10. A coreless current probe as claimed in claim 9, wherein each of said magnetic field sensors is orientated to have its axis of sensitivity parallel with said opening.

11. A coreless current probe as claimed in claim 9, wherein said sensing circuitry is adapted to derive as said measured current value the summation $$\sum_{r=1}^{n} c_r h_r$$

where the values of cr are selected such that in any homogeneous magnetic field and no enclosed current $$\sum_{r=1}^{n} c_r h_r = 0,$$

thereby maximizing rejection by the probe of external magnetic fields which are not produced by currents in a conductor engaged by the probe.

12. A coreless current probe as claimed in claim 9, wherein said plurality of sensors includes a first symmetrical pair of said sensors located and orientated in said body symmetrically with respect to a first plane of symmetry, and the
   values of cr for said first symmetrical pair of said sensors are selected such that, in a uniform magnetic field linking said first symmetrical pair of said sensors, the sum of the values crhr for said first symmetrical pair of said sensors is zero, whereby said values of cr for said first symmetrical pair of said sensors have a fixed relationship.

13. A coreless current probe as claimed in claim 12, wherein the respective axes of sensitivity of each of said first symmetrical pair of said sensors are aligned parallel to said first plane of symmetry, and said plurality of sensors includes a further symmetrical pair of said sensors located symmetrically with respect to a second plane of symmetry and at right angles to said first plane of symmetry, the respective axis of sensitivity of each of said further symmetrical pair of said sensors being aligned parallel to said second plane of symmetry, the values of cr for said second symmetrical pair of said sensors being selected such that, in any homogeneous field, the sum of the values crhr for said further symmetrical pair of said sensors is zero, whereby said values of cr for said further symmetrical pair of said sensors have a further fixed relationship.

14. A coreless current probe as claimed in claim 12, wherein said opening defined by said body is elongate in section to accommodate, a current carrying conductor having an elongate cross-section, said opening having a length and a width, and wherein said body is U-shaped having arms extending along said length of said opening, an open end and a cross piece forming a closed end opposite to said open end, said opening having said width between said arms and said length from said closed end to said open end.

15. A coreless current probe as claimed in claim 12, wherein the respective axes of sensitivity of each of said first symmetrical pair of said sensors are at equal and opposite acute angles to said first plane of symmetry, and said plurality of sensors further includes a second symmetrical pair of said sensors located and orientated in said body symmetrically with respect to said first plane of symmetry, each sensor of said second symmetrical pair of said sensors being also at equal and opposite acute angles to said first plane of symmetry, and the values cr for said second symmetrical pair of said sensors being selected such that, in a uniform magnetic field linking said second symmetrical pair of said sensors, the sum of the values crhr for said second symmetrical pair of said sensors is zero, and, in any homogeneous magnetic field, the sum of the values crhr for all the sensors of the first and second symmetrical pairs of said sensors is zero, whereby said values of cr for said first and second symmetrical pairs of said sensors all have fixed relationships with each other, and wherein said first and second symmetrical pairs of said sensors are symmetrically located and orientated with respect to a second plane of symmetry containing said central line and at right angles to said first plane of symmetry.

16. A method of measuring current flowing in a conductor having minimum and maximum orthogonal cross-sectional dimensions, the method comprising the steps of:
placing a sensor at a plurality of locations around a path of the conductor, said path having minimum and maximum orthogonal dimensions,
measuring a respective angle component of magnetic field at each of the plurality of locations on said path, an adjacent pair of said locations being at one end of said maximum dimension of said path and spaced apart by said minimum dimension of said path, and a third of said locations being at the other end of said maximum dimension of said path, said locations and the orientations of said respective angle components being selected such that there are values of cr for which, in any homogeneous magnetic field and no enclosed current, $$\sum_{r=1}^{n} c_r h_r = 0,$$

where n is the number of said locations,
hr is the measured value of said magnetic field component at the $r^{th}$ location, and cr is a constant factor for the $r^{th}$ location, where at least one value of cr differs from other values of cr,
and combining said measured values hr to produce a value of said current.

17. A method as claimed in claim 16, wherein the respective angle components are orientated in said integration plane.

18. A method as claimed in claim 16, wherein said step of combining performs the summation $$\sum_{r=1}^{n} c_r h_r,$$

where the values cr are selected such that in any homogenous magnetic field and no enclosed current $$\sum_{r=1}^{n} c_r h_r = 0,$$

thereby maximizing rejection in the summation of the influence of external magnetic fields which are not produced by current flowing in the conductor.

19. A method as claimed in claim 16, wherein said maximum orthogonal cross-sectional dimension of said conductor is not less than twice said minimum orthogonal cross-sectional dimension, and wherein a respective angle component of magnetic field is measured at least six locations on said path, said locations including
a) a first pair corresponding to said adjacent pair of said locations at said one end of said maximum dimension of said path,
b) a second pair at said other end of said maximum dimension of said path,
and c) a third pair substantially mid-way along said maximum dimension of said path;
said locations of each of said first, second and third pairs of locations being spaced uniformly apart on opposite sides of a plane of symmetry containing a central line of said conductor and parallel to said maximum orthogonal cross-sectional dimension of said conductor;
the respective angle component of magnetic field being measured at each of the locations of said first and second pairs of locations being in said integration plane and at an acute angle to said plane of symmetry so as to be generally tangential to said conductor;
the respective angle component of magnetic field being measured at each of the locations of said third pair of locations being in said integration plane and parallel to said plane of symmetry.

20. A method as claimed in claim 19, wherein said maximum orthogonal cross-sectional dimension of said conductor is greater than twice said minimum dimension of the conductor, and the spacing between each of said third pair of locations and a neighbouring location along said path of said first or second pairs of locations is greater than the spacing apart of the locations of said first pair of locations,
and, in said step of combining the selected values of cr for the locations of said third pair are greater than the selected values of cr for the locations of said first and second pairs.

21. A method of measuring current flowing in a conductor comprising the steps of:
placing a sensor at a plurality of locations around a path of the conductor;

measuring a respective angle component of magnetic field using the sensors, said locations being selected such that there are values of cr for which, in any homogeneous field and no enclosed current, $$\sum_{r=1}^{n} c_r h_r = 0,$$

where n is the number of locations,
hr is the measured value of said magnetic field component, and
cr is a constant factor for the rth location;
and combining said measured values hr, employing the summation $$\sum_{r=1}^{n} c_r h_r$$

with selected values of cr, to produce a value of said current, where at least one value of cr in said summation is different from other values of cr.

22. A method as claimed in claim 21, wherein the respective angle components are orientated in a plane normal to a central line of the conductor.

23. A method as claimed in claim 21, wherein the values of cr in said summation are selected such that in any homogenous magnetic field and no enclosed current $$\sum_{r=1}^{n} c_r h_r = 0,$$

thereby maximizing rejection of the influence of external magnetic fields which are not produced by current flowing in the conductor.

24. A method as claimed in claim 23, wherein said locations and orientations for said measuring step are selected to provide at least
a first set of said measured angle components having locations and orientations which have a first mutual symmetry centered around a central line of said conductor, such that values of cr for said first set of said measured components constitute a first set of values which have a first fixed relationship in order that the sum of the values crhr for said measured components of said first set is zero,
and a second set of said measured angle components having locations and orientations which have a second mutual symmetry centered around said central line, such that values of cr for said second set of said measured components constitute a second set of values which have a second fixed relationship in order that the sum of the values crhr for said measured components of said second set is zero,
wherein, the measured angle components of the second set do not share symmetry with the measured angle components of the first set, such that said second set of values of cr does not have a fixed relationship with the first set of values of cr when the sum of the values crhr for said measured components of both of said first and second sets together is zero.

25. A method as claimed in claim 24, adapted for measuring currents in conductors in multiple physical configurations with respective multiple magnetic field configurations, wherein said method includes providing a respective computer model of at least a selection of said multiple magnetic field configurations with the same predetermined current flowing in the conductor,
using the models to calculate for each selected magnetic field configuration said respective angle components of magnetic field at said plurality of locations,
calculating for each selected magnetic field configuration the summation $$\sum_{r=1}^{n} c_r h_r,$$

and selecting a relationship between the first and second sets of values of cr which minimizes differences in said calculated summations for the different selected magnetic field configurations.

26. A method as claimed in claim 21, wherein said measuring step includes measuring a first pair of said angle components which are symmetrical in both location and orientation with respect to a first plane of symmetry containing a central line of said conductor, and said combining step includes selecting values of cr for said first pair of measured components such that, in a uniform magnetic field linking said symmetrical locations of said first pair, the sum of the values crhr for said first pair of measured components is zero, whereby said values of cr for said first pair of measured components have a fixed relationship.

27. A method as claimed in claim 26, wherein the respective measured angle components of said first pair are oriented at equal and opposite acute angles to said first plane of symmetry;
said measuring step includes measuring a second pair of said angle components which are symmetrical in both location and orientation with respect to said first plane of symmetry, where said measured angle components of said second pair are also oriented at said equal and opposite acute angles to said first plane of symmetry;
and said combining step includes selecting values of cr for said second pair of measured components such that, in a uniform magnetic field linking said symmetrical locations of said second pair, the sum of the values crhr for said second pair of measured components is zero, and, in any homogeneous magnetic field, the sum of the values crhr for all the measured components of the first and second pairs is zero, whereby said values of cr for said first and second pairs of measured components all have a fixed relationship.

28. A method as claimed in claim 27, wherein said measured angle components of said first and second pairs are symmetrically located and orientated with respect to a second plane of symmetry containing said central line and at right angles to said first plane of symmetry.

29. A method as claimed in claim 21, wherein the measured angle components of said first pair are aligned parallel to said first plane of symmetry;
and said measuring step includes measuring a further pair of angle components which are symmetrical in both location and orientation with respect to a second plane of symmetry at right angles to said first plane of symmetry;

and the combining step includes selecting values of cr for said further pair of measured components such that, in any homogeneous field, the sum of the values crhr for said further pair of said measured components is zero, whereby said values of cr for said further pair of said measured components have a further fixed relationship.

\* \* \* \* \*